(12) United States Patent
Radosavljevic et al.

(10) Patent No.: US 11,670,686 B2
(45) Date of Patent: Jun. 6, 2023

(54) III-N NANOSTRUCTURES FORMED VIA CAVITY FILL

(71) Applicant: Intel Corporation, Santa Clara, CA (US)

(72) Inventors: Marko Radosavljevic, Portland, OR (US); Sansaptak Dasgupta, Hillsboro, OR (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 172 days.

(21) Appl. No.: 16/636,760

(22) PCT Filed: Sep. 26, 2017

(86) PCT No.: PCT/US2017/053348
§ 371 (c)(1),
(2) Date: Feb. 5, 2020

(87) PCT Pub. No.: WO2019/066766
PCT Pub. Date: Apr. 4, 2019

(65) Prior Publication Data
US 2020/0168708 A1    May 28, 2020

(51) Int. Cl.
*H01L 29/20* (2006.01)
*H01L 21/02* (2006.01)
(Continued)

(52) U.S. Cl.
CPC ...... *H01L 29/2003* (2013.01); *H01L 21/0254* (2013.01); *H01L 21/02642* (2013.01);
(Continued)

(58) Field of Classification Search
CPC ............ H01L 29/2003; H01L 21/0254; H01L 21/02642; H01L 29/775; H01L 29/7853;
(Continued)

(56) References Cited

U.S. PATENT DOCUMENTS 4,948,456 A * 8/1990 Schubert ........... H01L 21/02647
257/E21.571
6,140,177 A  10/2000 Schafer et al.
(Continued)

FOREIGN PATENT DOCUMENTS

WO   WO-2015047316 A1 *  4/2015   ....... H01L 29/66484
WO      2015099668 A1      7/2015
(Continued)

OTHER PUBLICATIONS

Bashir et al., Reduction of sidewall defect induced leakage currents by the use of nitrided field oxides in silicon selective epitaxial growth isolation for advanced ultralarge scale integration, Journal of Vacuum Science & Technology B, 18(2), (2000), pp. 695-699 (Year: 2000).*

(Continued)

*Primary Examiner* — Earl N Taylor
(74) *Attorney, Agent, or Firm* — Akona IP

(57) ABSTRACT

A method for forming III-N structures of desired nanoscale dimensions is disclosed. The method is based on, first, providing a material to serve as a shell inside which a cavity can be formed, followed by using epitaxial growth to fill the cavity with III-N semiconductor(s). Filling a cavity of specified shape and dimensions with a III-N semiconductor results in formation of a III-N structure which has shape and dimensions defined by those of the cavity in the shell, advantageously enabling formation of III-N structures on a nanometer scale without having to rely on etching of III-N materials. Ensuring that at least a part of the III-N material in the cavity is formed by lateral epitaxial overgrowth allows obtaining high quality III-N semiconductor in that part without having to grow a thick layer. Disclosed III-N nanostructures can serve as foundation for fabricating III-N (Continued)

device components, e.g. III-N transistors, having non-planar architecture.

19 Claims, 14 Drawing Sheets

(51) Int. Cl.
  *H01L 29/66* (2006.01)
  *H01L 29/778* (2006.01)
  *H01L 29/775* (2006.01)
  *H01L 29/78* (2006.01)

(52) U.S. Cl.
  CPC ...... *H01L 21/02647* (2013.01); *H01L 29/775* (2013.01); *H01L 29/7853* (2013.01); *H01L 29/66462* (2013.01); *H01L 29/7786* (2013.01); *H01L 2029/7858* (2013.01)

(58) Field of Classification Search
  CPC ....... H01L 2029/7858; H01L 21/02587; H01L 21/0262; H01L 21/02639; H01L 21/02381; H01L 21/02546; H01L 29/66462; H01L 29/7786; H01L 29/06; H01L 29/66795; H01L 29/785
  See application file for complete search history.

(56) References Cited

U.S. PATENT DOCUMENTS

| | | | | |
|---|---|---|---|---|
| 7,777,250 | B2* | 8/2010 | Lochtefeld | H01L 21/0254 257/190 |
| 7,799,592 | B2* | 9/2010 | Lochtefeld | H01L 29/7851 257/190 |
| 8,324,660 | B2* | 12/2012 | Lochtefeld | H01L 21/02612 257/190 |
| 8,368,118 | B2* | 2/2013 | Wang | H01L 21/02639 257/190 |
| 8,822,248 | B2* | 9/2014 | Park | C30B 29/40 257/615 |
| 8,981,427 | B2* | 3/2015 | Hydrick | H01L 21/02433 257/190 |
| 9,153,645 | B2* | 10/2015 | Li | H01L 29/1054 |
| 9,711,352 | B2* | 7/2017 | Han | H01L 23/49827 |
| 10,497,785 | B2* | 12/2019 | Dasgupta | H01L 21/0254 |
| 10,658,471 | B2* | 5/2020 | Dasgupta | H01L 21/02433 |
| 11,183,559 | B2* | 11/2021 | Borg | H01L 29/0657 |
| 2004/0000687 | A1 | 1/2004 | Lee et al. | |
| 2006/0046380 | A1 | 3/2006 | Choi et al. | |
| 2006/0113605 | A1* | 6/2006 | Currie | H01L 27/1207 257/E29.296 |
| 2007/0234538 | A1 | 10/2007 | Ahn | |
| 2012/0193757 | A1 | 8/2012 | Shih et al. | |
| 2014/0015097 | A1 | 1/2014 | Greeley et al. | |
| 2014/0084343 | A1* | 3/2014 | Dewey | H01L 29/513 977/734 |
| 2014/0175515 | A1* | 6/2014 | Then | H01L 21/0251 438/168 |
| 2014/0353589 | A1 | 12/2014 | Cao et al. | |
| 2015/0061074 | A1 | 3/2015 | Lee et al. | |
| 2015/0228747 | A1 | 8/2015 | Kwon et al. | |
| 2016/0027636 | A1* | 1/2016 | Han | H01L 21/02422 257/737 |
| 2016/0204207 | A1* | 7/2016 | Then | H01L 29/42392 438/285 |
| 2017/0018640 | A1* | 1/2017 | Then | H01L 21/02636 |
| 2018/0350921 | A1* | 12/2018 | Dasgupta | H01L 21/02609 |
| 2019/0058041 | A1* | 2/2019 | Dasgupta | H01L 27/0924 |
| 2020/0168708 | A1* | 5/2020 | Radosavljevic | H01L 29/7853 |
| 2020/0373381 | A1 | 11/2020 | Radosavljevic et al. | |

FOREIGN PATENT DOCUMENTS

| | | | | |
|---|---|---|---|---|
| WO | WO-2015147816 | A1* | 10/2015 | ........... H01L 29/205 |
| WO | 2017111852 | A1 | 6/2017 | |
| WO | WO-2017171700 | A1* | 10/2017 | ....... H01L 21/02458 |
| WO | 2019066765 | A1 | 4/2019 | |
| WO | 2019066766 | A1 | 4/2019 | |

OTHER PUBLICATIONS

Ju et al., Epitaxial lateral overgrowth of gallium nitride on silicon substrate, Journal of Crystal Growth, 263, (2004), pp. 30-34 (Year: 2004).*

Gupta et al., Selective epitaxy and lateral overgrowth of 3C—SiC on Si—A review, Progress in Crystal Growth and Characterization of Materials, 51, (2005), pp. 43-69 (Year: 2005).*

PCT International Search Report and Written Opinion of PCT Application No. PCT/US2017/053347; dated Jun. 22, 2018; 14 pages.

USPTO U.S. Appl. No. 16/636,876, filed Feb. 5, 2020, entitled "High Aspect Ratio Non-Planar Capacitors Formed via Cavity Fill".

PCT International Search Report and Written Opinion of PCT Application No. PCT/US2017/053348 dated Jun. 27, 2018; 13 pages.

USPTO Non-Final Office Action issued in U.S. Appl. No. 16/636,876 dated May 14, 2021; 27 pages.

* cited by examiner

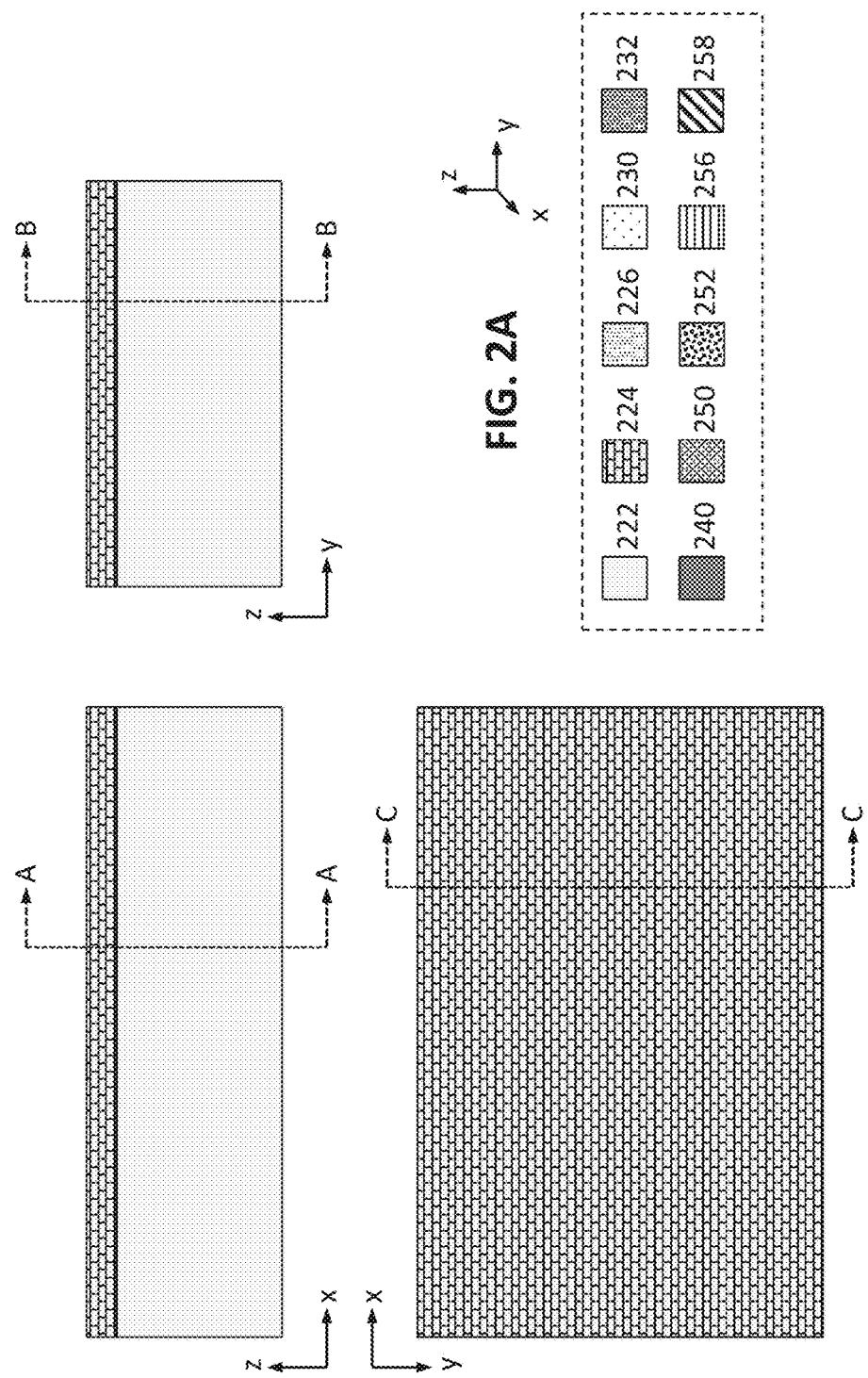

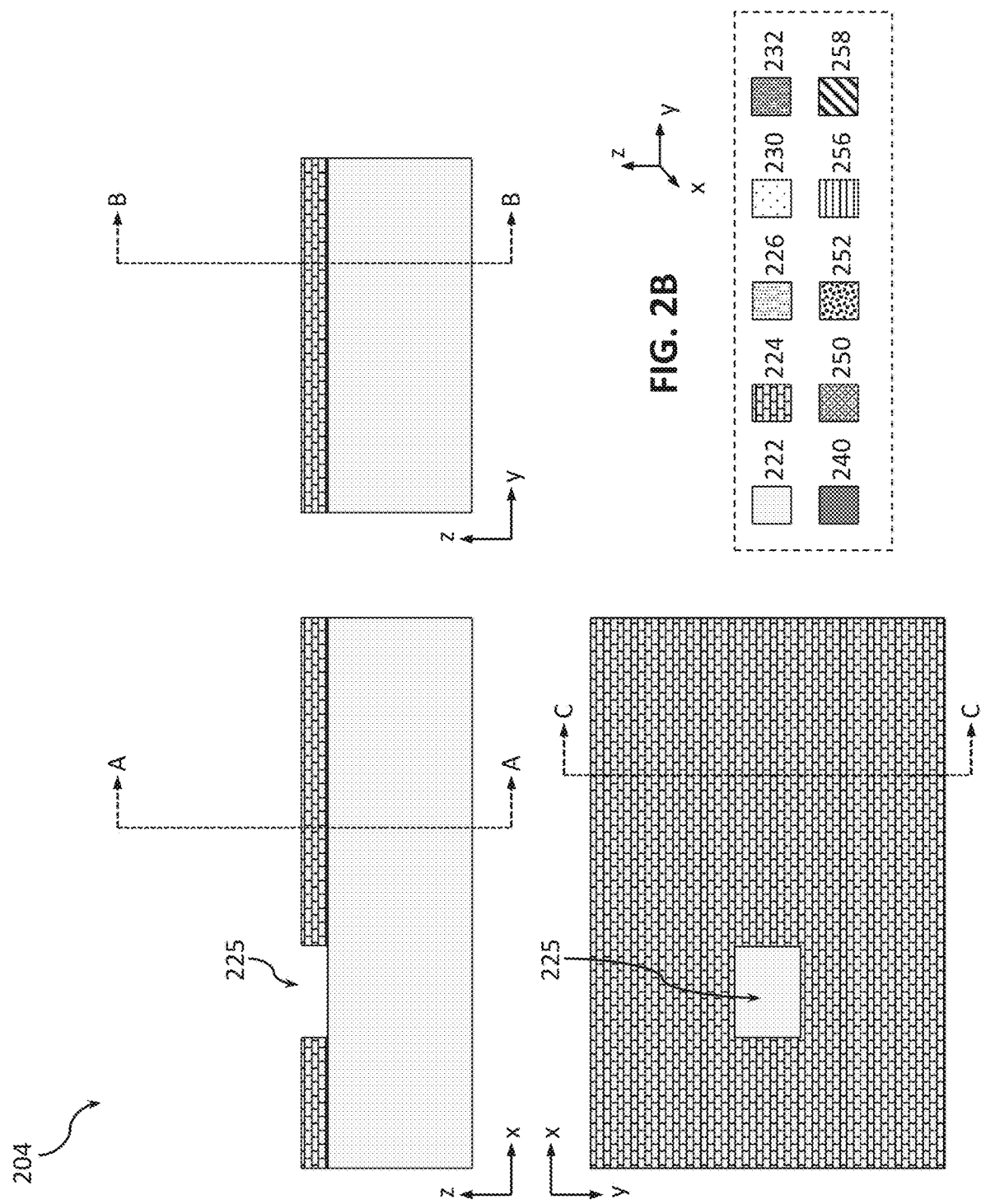

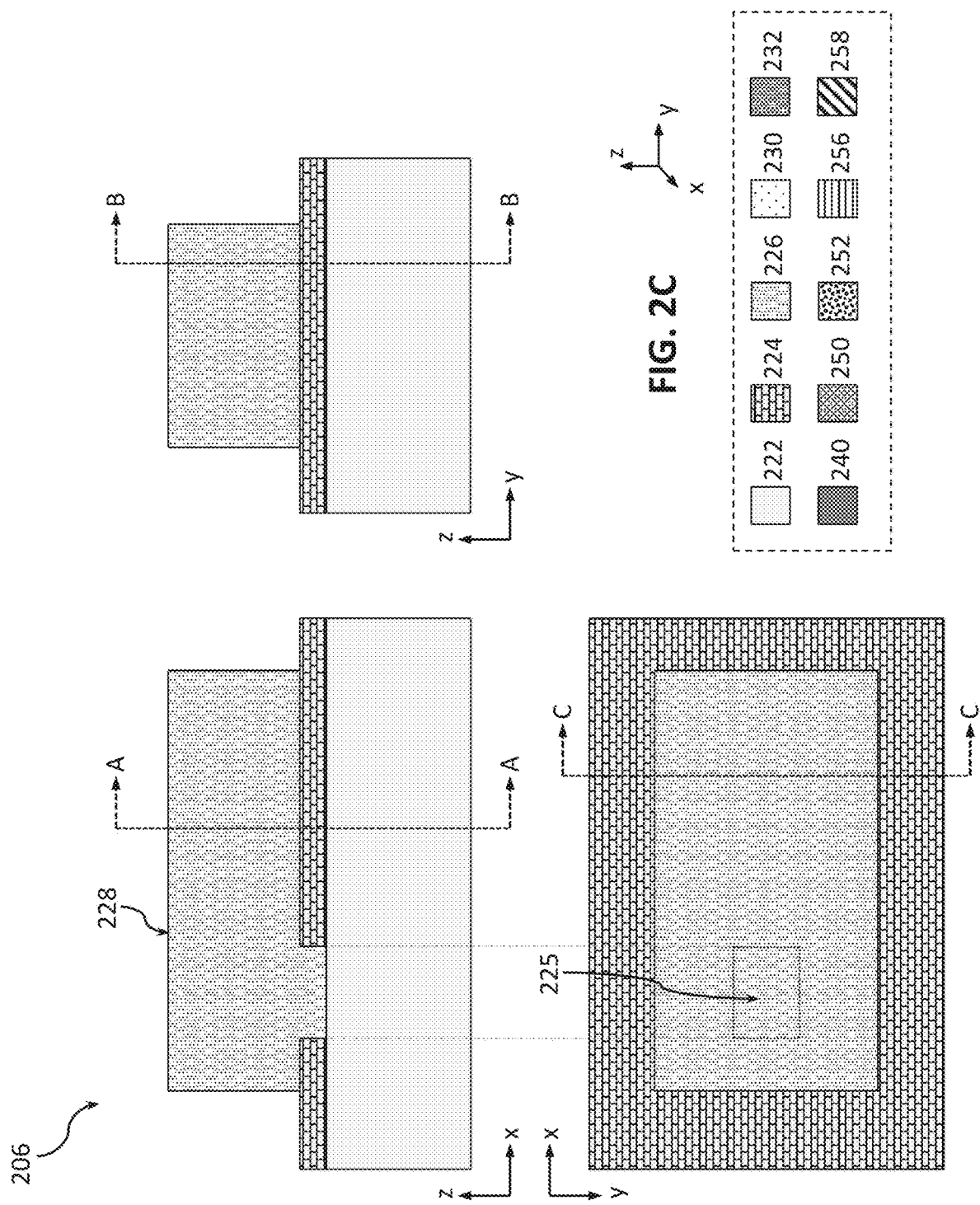

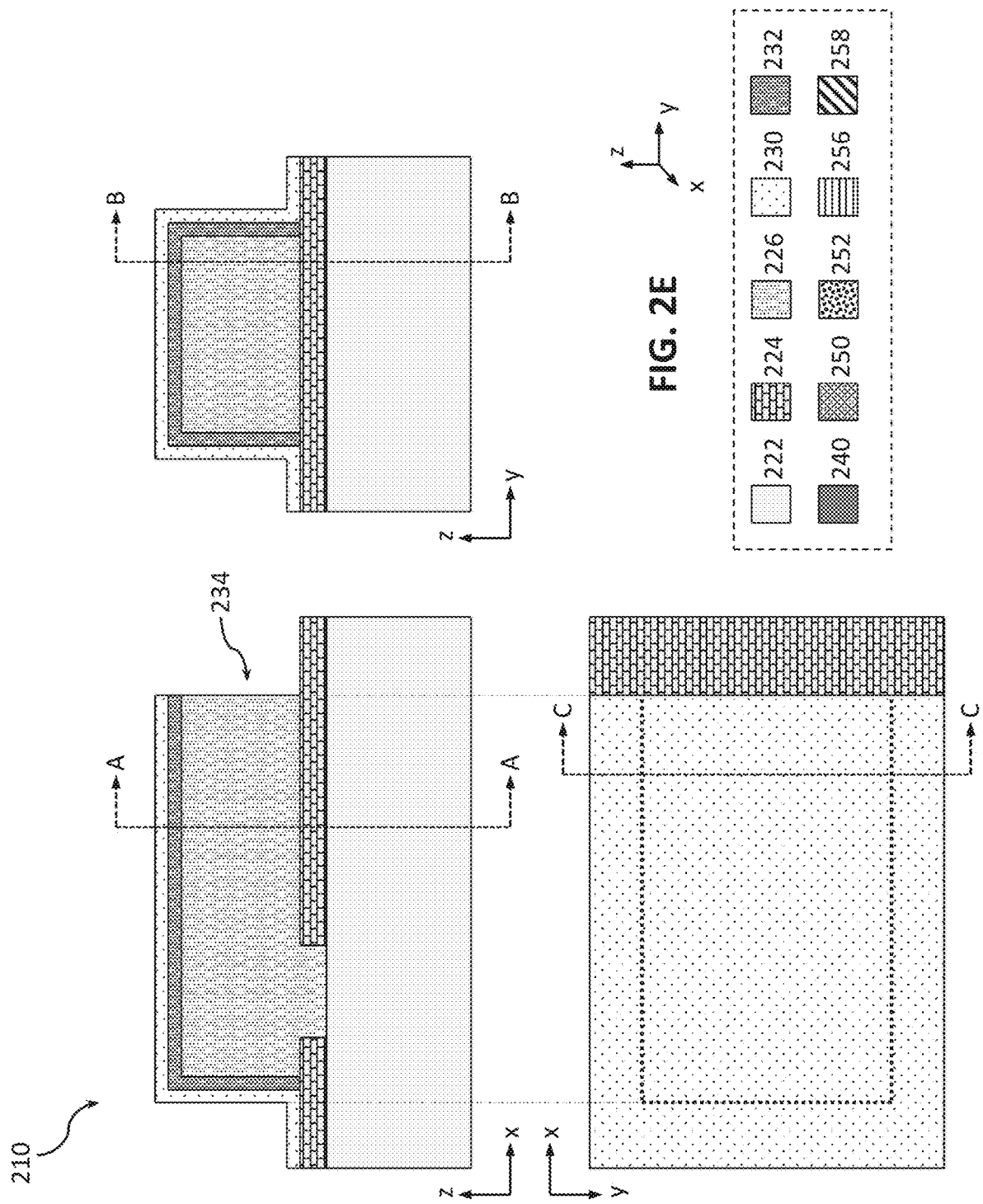

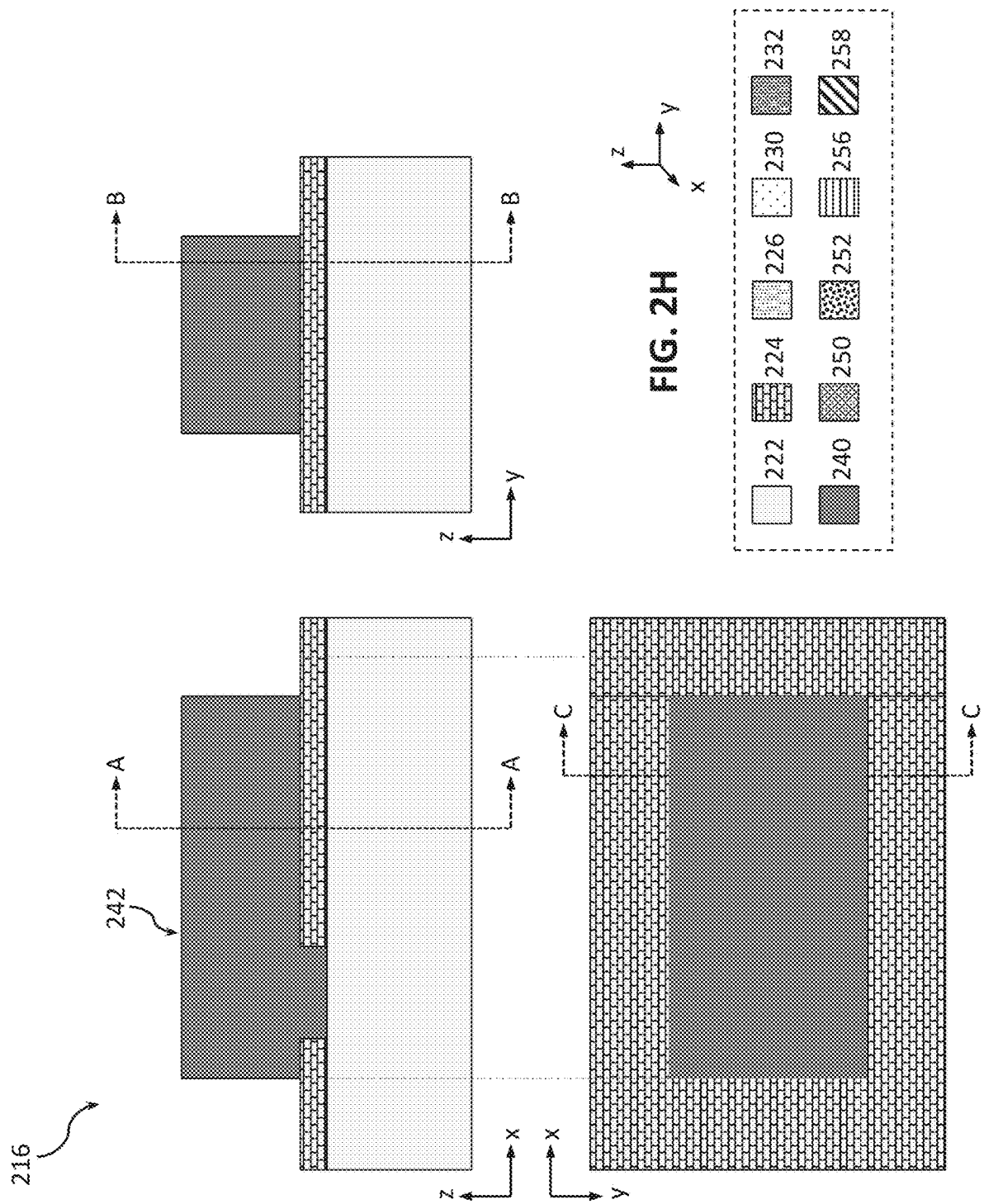

III-N NANOSTRUCTURES FORMED VIA CAVITY FILL

CROSS-REFERENCE TO RELATED APPLICATION

This application is a national stage application under 35 U.S.C. § 371 of PCT International Application Serial No. PCT/US2017/053348, filed on Sep. 26, 2017 and entitled "III-N NANOSTRUCTURES FORMED VIA CAVITY FILL," which is hereby incorporated by reference herein in its entirety.

TECHNICAL FIELD

This disclosure relates generally to the field of semiconductor devices, and more specifically, to III-N nanostructures for non-planar III-N device components, as well as methods for forming such nanostructures.

BACKGROUND

Solid-state devices that can be used in high voltage and/or high frequency applications are of great importance in modern semiconductor technologies. For example, power management integrated circuits (PMIC) and radio frequency integrated circuits (RFIC) may be critical functional blocks in system-on-a-chip (SoC) implementations. Such SoC implementations may be found in mobile computing platforms such as smartphones, tablets, laptops, netbooks, and the like. In such implementations, the PMIC and RFIC are important factors for power efficiency and form factor, and can be equally or even more important than logic and memory circuits.

Due, in part, to their large bandgap and high mobility, III-N material based transistors, such as e.g. gallium nitride (GaN) based transistors, may be particularly advantageous for high voltage and/or high frequency applications. For example, because GaN has a larger band gap than silicon (Si), namely a band gap of about 3.4 electron volt (eV) for GaN compared to that of about 1.1 eV for Si, a GaN transistor should be able to withstand a larger electric field (resulting e.g. from applying a larger voltage to the drain, Vdd) before suffering breakdown, compared to a Si transistor of similar dimensions. Furthermore, GaN transistors may advantageously employ a 2D electron gas (i.e. a group of electrons, an electron gas, free to move in two dimensions but tightly confined in the third dimension, e.g. a 2D sheet charge) as its transport channel, enabling high mobilities without using impurity dopants. For example, the 2D sheet charge may be formed at an abrupt hetero-interface formed by epitaxial deposition, on GaN, of a charge-inducing film of a material having larger spontaneous and piezoelectric polarization than GaN (such a film is generally referred to as a "polarization layer"). Providing a polarization layer on a III-N material allows forming very high charge densities, e.g. densities of about $2 \cdot 10^{13}$ charges per square centimeter ($cm^2$), without impurity dopants, which, in turn, enables high mobilities, e.g. mobilities greater than about 1000 $cm^2/(Vs)$.

Despite the advantages, there are some challenges in manufacturing III-N transistors (or, in general, III-V device components) which hinder their large-scale implementation. One such challenge is that III-N materials are very difficult to etch into desired geometries. For example, dry etch of III-N materials such as GaN damages surfaces of the remaining GaN, significantly impacting performance of final devices. While typical etches for conventional materials such as Si can rely on wet cleans to repair crystalline damage (i.e. damage to the pristine substantially monocrystalline structure of a material) as well as damage due to growth of native oxide caused by dry etch, no known wet cleans or adequate alternative techniques currently exist for most of the III-N materials. Such difficulties with etching limit application of III-N materials in various non-planar architectures required for keeping up with the continuous demand of device scaling where more and more devices need to be fitted into a given area.

Another challenge resides in that, with current approaches to growing III-N materials, thick layers of such materials are needed to obtain a III-N semiconductor layer of sufficiently high quality for serving as an active layer for III-N devices, e.g. for serving as a channel material for III-N transistors. For that reason, III-N layers which are at least 500, or even 1000, nanometers (nm) thick are currently used. However, adapting various techniques and equipment used in modern very-large-scale integration (VLSI) processing to be compatible with such thick structures can be very difficult and create further issues, e.g. performing planarization on or filling high aspect ratio openings formed in such structures can be very challenging.

Improvements on one or more of these challenges would be desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2A-2I illustrate various exemplary stages in the manufacture of a III-N semiconductor device assembly using the method shown in FIG. 1, in accordance with various embodiments of the present disclosure.

DETAILED DESCRIPTION

Figure 1:
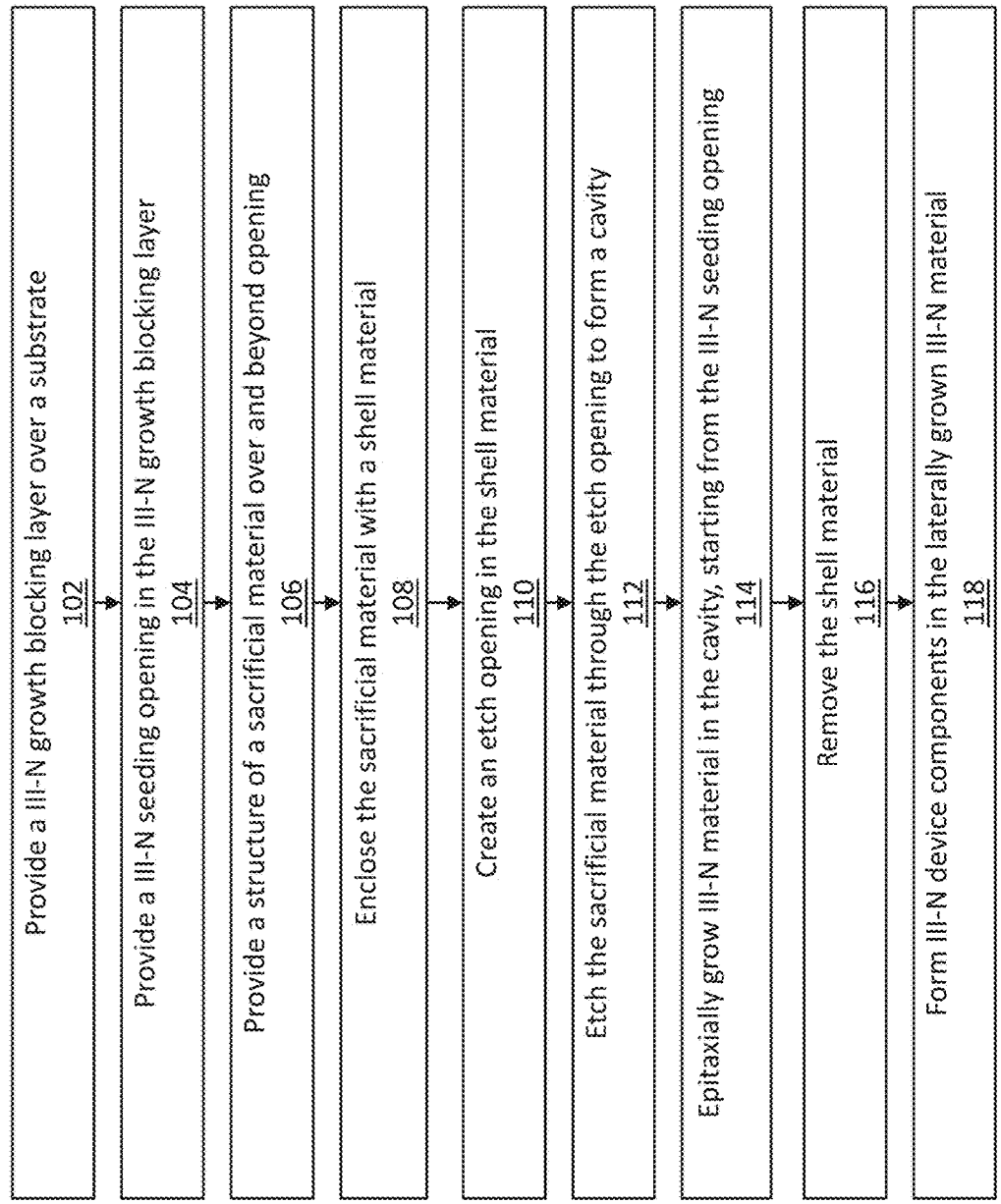
FIG. 1 is a flow diagram of an exemplary method for manufacturing a III-N semiconductor device assembly by forming a III-N nanostructure using cavity fill, in accordance with various embodiments of the present disclosure.

Disclosed herein is a cavity fill method for forming III-N nanostructures of desired dimensions, as well as some exemplary device assemblies which utilize such nanostructures. As used herein, the term "III-N nanostructure" refers to a structure made of nitrogen (N) in combination with one or more elements which belong to group III of the periodic table of elements, g. GaN. The term "nano" in the "nanostructure" implies that at least some dimensions of such a structure may be on a nanometer scale, e.g. between subnanometers to a few tens or a few hundreds of nanometers. The term "III-N device component" (or, simply, "III-N device") refers to a semiconductor device component, such as e.g. a transistor, which employs a material having nitrogen in combination with one or more elements which belong to group ill of the periodic table of elements as an active material. While some embodiments described herein refer to III-N transistors (i.e. transistors employing one or more III-N materials as a channel material), these embodiments are equally applicable to any III-N device components besides transistors, such as e.g. III-N diodes, sensors, light-emitting diodes (LEDs), and lasers.

One aspect of the present disclosure provides a method for forming III-N structures of desired nanoscale dimensions. The method is based on, first, providing a material which can serve as a shell, i.e. a solid outer case inside which a cavity can be formed, and then using epitaxial growth to fill the cavity of the shell with a III-N semiconductor material. Hence, the method is referred to herein as a "cavity fill" method. Shape and dimensions of the cavity are substantially those desired for a final III-N structure. Filling a cavity of specified shape and dimensions with a III-N material results in formation of a III-N structure which has shape and dimensions defined by those of the cavity in the shell, advantageously enabling formation of III-N structures on a nanometer scale without having to rely on etching of III-N materials. In turn, such nanostructures can later be used as foundation for fabricating III-N device components having non-planar architecture (e.g. III-N nanowire-like transistors). Ensuring that at least a part of the III-N material in the cavity is formed by lateral epitaxial overgrowth (LEO) (also known as "epitaxial lateral overgrowth" (ELO)), as opposed to purely vertical growth, allows obtaining high quality III-N semiconductor material in that part without having to grow a thick III-N layer. Such, relatively thin but high quality, III-N semiconductor material can then serve as an active material for one or more III-N device components (e.g. a channel material for III-N transistors), which device components can now be manufactured using techniques compatible with modern VLSI processing due to the reduced thickness of the active III-N material compared to conventional implementations.

Another aspect of the present disclosure provides an exemplary device assembly that includes a substrate, a dielectric layer provided over a portion of the substrate, and a nanostructure of a III-N semiconductor material formed over the substrate using the cavity fill method described herein. A portion of the III-N material of the nanostructure is provided over a portion of the dielectric layer and has a thickness/height less than about 200 nanometers, e.g. between about 5 and 50 nm, or between about 10 and 20 nm. Such a portion of the III-N material is formed by ELO and, therefore, is of sufficiently high quality to serve as an active material for a III-N device component, e.g. to serve as a channel material for a III-N transistor.

III-N semiconductor device assemblies implementing having III-N nanostructures formed via cavity fill as described herein may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on an IC, provided as an integral part of an IC, or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

In the following detailed description, reference is made to the accompanying drawings that form a part hereof, and in which are shown, by way of illustration, embodiments that may be practiced. The accompanying drawings are not necessarily drawn to scale. For example, to clarify various layers, structures, and regions, the thickness of some layers may be enlarged. Furthermore, while drawings illustrating various structures/assemblies of exemplary devices may be drawn with precise right angles and straight lines, real world process limitations may prevent implementations of devices exactly as shown. Therefore, it is understood that such drawings revised to reflect example real world process limitations, in that the features may not have precise right angles and straight lines, are within the scope of the present disclosure. Drawings revised in this manner may be more representative of real world structure/assemblies as may be seen on images using various characterization tools, such as e.g. scanning electron microscopy (SEM) or transmission electron microscopy (TEM). In addition, the various structures/assemblies of the present drawings may further include possible processing defects, such as e.g. the rounding of corners, the drooping of the layers/lines, unintentional gaps and/or discontinuities, unintentionally uneven surfaces and volumes, etc., although these possible processing defects may not be specifically shown in the drawings. It is to be understood that other embodiments may be utilized and structural or logical changes to the drawings and descriptions may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The meaning of "a," "an," and "the" include plural references. The meaning of "in" includes "in" and "on."

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Furthermore, stating in the present disclosure that any part (e.g. a layer, film, area, or plate) is in any way positioned on or over (e.g. positioned on/over, provided on/over, located on/over, disposed on/over, formed on/over, etc.) another part means that the referenced part is either in contact with the other part, or that the referenced part is above the other part with one or more intermediate part(s) located therebetween. On the other hand, stating that any part is in contact with another part means that there is no intermediate part between the two parts.

The terms "substantially," "close," "approximately," "near," and "about," generally refer to being within +/−20% of a target value. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. In some examples, as used herein, a "high-k dielectric" refers to a material having a higher dielectric constant than silicon oxide, while the terms "oxide," "carbide," "nitride," etc. refer to compounds containing, respectively, oxygen, carbon, nitrogen, etc. In another example, the term "connected" means a direct electrical or magnetic connection between the things that are connected, without any intermediary devices, while the term "coupled" means either a direct electrical or magnetic connection between the things that are connected or an indirect connection through one or more passive or active intermediary devices. The term "circuit" means one or more passive and/or active components that are arranged to cooperate with one another to provide a desired function.

Embodiments of the present disclosure provide III-N device assemblies with non-planar structures of III-N semiconductor materials formed using a cavity fill method described herein. Such III-N structures enable fabrication of non-planar III-N device components in a manner compatible with common VLSI processing techniques.

FIG. 1 is a flow diagram of an exemplary method 100 for manufacturing a III-N semiconductor device assembly by forming a III-N nanostructure using cavity fill, in accordance with various embodiments of the present disclosure. III-N device assemblies in various example stages during the manufacture using the method 100 are illustrated in FIGS. 2A-2I, in accordance with some embodiments of the present disclosure.

Each of FIGS. 2A-2I provides three views of an exemplary III-N semiconductor device assembly after a respective process of the method 100 shown in FIG. 1 has been performed. Namely, the top left view of each of FIGS. 2A-2I is a cross-sectional view of the assembly with the cross-section taken "along" the length of the final III-N nanostructure, the top right view of each of FIGS. 2A-2I is a cross-sectional view of the assembly with the cross-section taken perpendicular to the length of the III-N nanostructure, and the bottom left view of each of FIGS. 2A-2I is a top view of the assembly. With reference to the x-y-z coordinate system shown in FIGS. 2A-2I, the top left view is the view in the x-z plane, the top right view is the view in the y-z plane, and the bottom view is the view in the y-x plane. In each of FIGS. 2A-2I, the top right view is a cross-section of the respective assembly along the plane A-A of the top left view and a cross-section along the plane C-C of the bottom view, while the top left view is a cross-section along the plane B-B of the top right view. Dashed lines A-A, B-B, and C-C shown in each of FIGS. 2A-2I are intended to illustrate planes which include those lines and are perpendicular to the plane of the drawings.

A number of elements referred to in the description of FIGS. 2A-2I with reference numerals are indicated in these FIGS. with different patterns in order to not clutter the drawings, with a legend at the bottom of FIGS. 2A-2I showing the correspondence between the reference numerals and the patterns.

Various operations of the method 100 may be illustrated in FIGS. 2A-2I with some exemplary assemblies and explained with reference to some exemplary embodiments discussed below, but the method 100 may be used to manufacture any suitable III-N device assemblies with III-N nanostructures according to any embodiments of the present disclosure. In addition, although the operations of the method 100 are illustrated in FIG. 1 once each and in a particular order, the operations may be performed in any suitable order and repeated as desired. For example, one or more operations may be performed in parallel to manufacture multiple III-N device assemblies with non-planar III-N nanostructures as described herein substantially simultaneously. In another example, the operations may be performed in a different order to reflect the architecture of a particular III-N device component in which one or more III-N nanostructures as described herein are to be included.

In addition, the manufacturing method 100 may include other operations, not specifically shown in FIG. 1, such as e.g. various cleaning operations as known in the art. For example, in some embodiments, the III-N device assembly may be cleaned prior to or/and after any of the processes of the method 100 described herein, e.g. to remove surface-bound organic and metallic contaminants, as well as sub-surface contamination. In some embodiments, cleaning may be carried out using e.g. a chemical solutions (such as peroxide), and/or with ultraviolet (UV) radiation combined with ozone, and/or oxidizing the surface (e.g., using thermal oxidation) then removing the oxide (e.g. using hydrofluoric acid (HF)).

As shown in FIG. 1, the method 100 may begin with a process 102 that includes providing, over at least a portion of a substrate, a layer of a material which may be referred to as a "III-N growth blocking layer" for the reasons which will become apparent from the explanations below. An exemplary result of the process 102 is illustrated with a device assembly 202 shown in FIG. 2A where a portion of a substrate 222 is covered with a III-N growth blocking layer 224.

The substrate 222 may be any substrate on which III-N devices as described herein may be implemented. In some embodiments, the substrate 222 may include a semiconductor, such as silicon. In other implementations, the semiconductor substrate may be formed using alternate materials, which may or may not be combined with silicon, that include but are not limited to germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. Although a few examples of materials from which the substrate may be formed are described here, any material that may serve as a foundation upon which a semiconductor device may be built falls within the spirit and scope of the present disclosure.

In some embodiments, the substrate 222 may be a crystalline substrate. In other embodiments, the substrate 222 may be non-crystalline, in which case, for the reasons explained below, a layer of a crystalline material may need to be provided over the substrate 222, prior to the deposition of the III-N growth blocking layer 224, at least in an area where epitaxial growth of the III-N material is to be seeded from at a later process of the method 100 (process 114).

The III-N growth blocking layer 224 may be a layer of any dielectric material that can serve to prevent that the epitaxial growth of the III-N material in a subsequent fabrication process of the method 100 (process 114) is seeded from it. In some implementations, an additional functionality of the III-N blocking layer 224 may be to electrically isolate the semiconductor material of the substrate 222 from the active III-N material of a III-N device component (e.g. a III-N channel material of a III-N transistor) formed on the substrate 222 at a later process, and thereby mitigate the likelihood that a conductive pathway will form between e.g. a source and a drain regions of a given III-N transistor, or between neighboring III-N transistors, through the substrate 222.

In general, the dielectric material of the III-N growth blocking layer 224 may e.g. Include any of the low-k or high-k dielectric materials as commonly used in semiconductor processing, including but not limited to elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used as the III-N growth blocking layer 224 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. Examples of low-k materials that may be used as the III-N growth blocking layer 224 may include, but are not limited to, fluorine-doped silicon dioxide, carbon-doped silicon dioxide, spin-on organic polymeric dielectrics such as e.g. polyimide, polynorbornenes, benzocyclobutene, and polytetrafluoroethylene (PTFE), or spin-on silicon-based polymeric dielectric such as e.g. hydrogen silsesquioxane (HSQ) and methylsilsesquioxane (MSQ)).

In various embodiments, a thickness of the III-N growth blocking layer 224 (i.e. a dimension measured along the z-axis of the coordinate system shown in FIGS. 2A-2I) provided in the process 102 may be between about 2 and 50 nm, e.g. between about 3 and 30 nm, or between about 5 and 10 nm. Any suitable deposition techniques may be used to provide the III-N growth blocking layer 224, such as e.g. spin-coating, dip-coating, chemical vapor deposition (CVD), ALD, PECVD, thermal oxidation. In some embodiments, deposition of the III-N growth blocking layer 224 in the process 102 may, optionally, be performed in combination with patterning, such as e.g. photolithographic or electron-beam patterning, to ensure that the layer 224 is provided only over a certain continuous area of the substrate 222 (such a continuous area is shown with the top view of FIG. 2A), but not entire substrate, in case such coverage is needed.

The method 100 may then proceed with a process 104 of providing an opening which may be referred to as a "III-N seeding opening" in the III-N growth blocking layer. An exemplary result of the process 104 is illustrated with a device assembly 204 shown in FIG. 2B where an opening 225 is formed in the III-N growth blocking layer 224. As is known in the art, epitaxial growth of a III-N semiconductor material can only be seeded, i.e. can only initiate, from a crystalline surface. An opening created in the process 104 exposes a portion of an underlying crystalline surface of the substrate 222 in the otherwise non-crystalline surface of the III-N growth blocking layer 224, to enable initiation of the epitaxial growth of a III-N semiconductor material from such exposed crystalline surface at a later process (process 114, described below).

In general, more than one openings may be provided in the process 104 in order to provide more than one separate areas for initiating III-N growth, and any of the openings created in the process 104 do not have to be rectangular in shape as is shown in FIG. 2B. In various embodiments, the opening 225 may take any form and dimension suitable for exposing a portion of an underlying crystalline surface of the substrate 222. For example, in some embodiments the opening 225 may have an area of between about 400 and 250,000 nm$^2$, e.g. between about 900 and 160,000 nm$^2$, or between about 1,600 and 90,000 nm$^2$. In various embodiments, any suitable process for removing the material of the III-N growth blocking layer 224 may be used to create the opening 225, such as e.g. dry etch or wet etch or combination of both, with processes and/or chemistries being dependent largely on the films utilized the III-N growth blocking layer 224. Specifically it would be particularly advantageous that the etch lands gently on the underlying substrate 222 so that the epitaxial growth process can be initiated from a surface that is not severely damaged by the etch. In some embodiments, processes 102 and 104 may be combined in that the III-N growth blocking layer is provided over the substrate using patterning so that one or more III-N seeding openings are already there as the III-N growth blocking layer is provided and the III-N growth blocking material does not have to be removed in a separate process.

The method 100 may then proceed with a process 106 of providing a three-dimensional structure of a sacrificial material 226 over and beyond the III-N seeding opening formed in the process 104. An exemplary result of the process 106 is illustrated with a device assembly 206 shown in FIG. 2C where a structure 228 is provided over and extending beyond the opening 225. The bottom view of FIG. 2C illustrates location of the opening 225 below the structure 228 with a dotted line outlining the opening 225, and dashed-dotted lines between the top left and the bottom views of FIG. 2C intended to illustrate alignment of the location of the opening 225 between these two views.

In general, the structure of the sacrificial material 226 formed in the process 106 does not have to be in the shape or a parallelepiped as is shown in FIG. 2C and may take on other forms. However, the shape and dimensions of the structure formed in the process 106 should be selected appropriately keeping in mind that the shape and dimensions of this structure will later define the shape and dimensions of a cavity in which a III-N semiconductor material will grow. In various embodiments, any suitable deposition and patterning techniques may be used in the process 106 to provide the structure 228 of the sacrificial material 226, such as e.g. any of the techniques described above with respect to patterning of the III-N growth blocking layer 224.

The sacrificial material 226 may include any material that has sufficient etch selectivity with respect to the III-N growth blocking layer 224, the substrate 222, and a shell material deposited around the structure of the sacrificial material 226 in a later process (process 108, described below). As known in the art, two materials are said to have "sufficient etch selectivity" when etchants used to etch one material do not substantially etch the other, enabling selective etching of one material but not the other. In some embodiments, the sacrificial material 226 may be a sacrificial dielectric material, e.g. any of the dielectric materials described above for use as the III-N growth blocking layer 224, as long as different dielectric materials with sufficient etch selectivity are used for the III-N growth blocking layer 224 and the sacrificial material 226. For example, in some embodiments, the III-N growth blocking layer 224 may include a dielectric material including, or being, one or more of a silicon oxide (i.e. a compound comprising silicon and oxygen, e.g. SiO2) and a hafnium oxide (i.e. a compound comprising hafnium and oxygen e.g. HfO2), while the sacrificial material 226 may include a dielectric material having sufficient etch selectivity with respect to the material of the growth blocking layer 224 and being selected as one or more of a silicon oxide, a hafnium oxide, a silicon nitride (i.e. a compound comprising silicon and nitrogen, e.g. SiN), a silicon oxynitride (i.e. a compound comprising silicon, oxygen, and nitrogen, e.g. SiON), an aluminum oxide (i.e. a compound comprising aluminum and oxygen, e.g. Al2O3), an aluminum hafnium oxide (i.e. a compound comprising aluminum, hafnium, and oxygen, e.g. AlHfO), a carbon-doped oxide (i.e. a compound comprising carbon and oxygen), organic polymers such as perfluorocyclobutane or polytetrafluoroethylene, fluorosilicate glass (FSG), and organosilicates such as silsesquioxane, siloxane, or organo-silicate glass. Besides appropriate etching characteristics, some other considerations in selecting a suitable material for forming the structure 228 may include e.g. possibilities of smooth film formation, low shrinkage and outgassing, and good dielectric properties (such as e.g. low electrical leakage, suitable value of a dielectric constant, and thermal stability).

Next, the method 100 may proceed with a process 108 of enclosing the three-dimensional structure of the sacrificial material provided in the process 106 with a shell material. An exemplary result of the process 108 is illustrated with a device assembly 208 shown in FIG. 2D where the structure 228 is shown to be enclosed completely with a shell material 230. In general, the shell material 230 may be any material within which a cavity can be formed in a later process by removing at least some of the sacrificial dielectric material 226, the shell material satisfying the etch selectivity considerations provided above. Inventors of the present disclosure realized that a material that includes aluminum and nitrogen, e.g. aluminum nitride (AlN), may be particularly advantageous for use as the shell material 230, reasons for which are explained below.

Figure 2D:
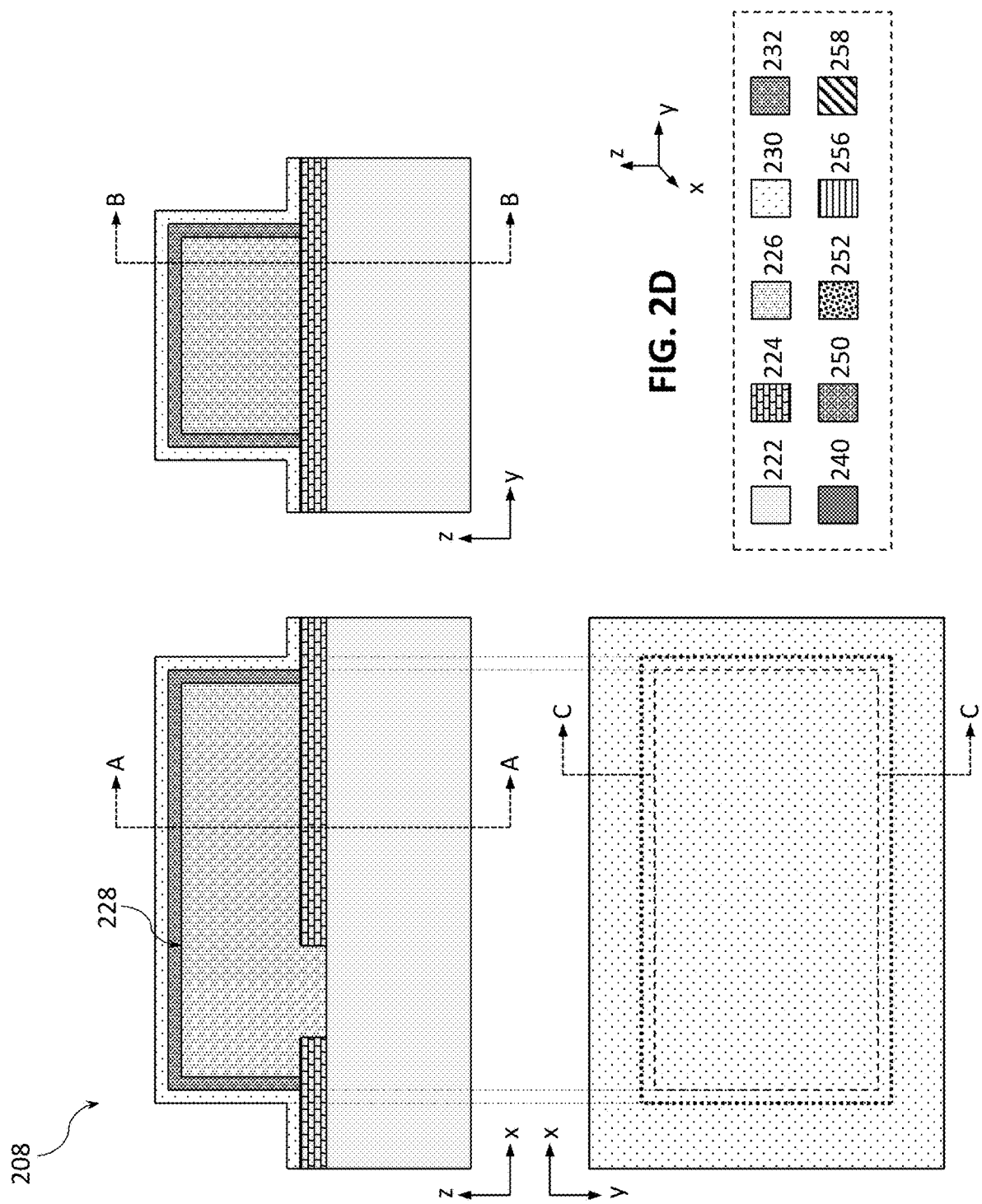

It was realized that high temperature (i.e. temperatures of about 1000 degrees Celsius) deposition of AlN provides additional hardening to the sacrificial dielectric material 226 near the deposition of AlN, thus creating a liner of a hardened dielectric material which is etch-selective with respect to the original sacrificial dielectric deposited in the process 106. The device assembly 208 of FIG. 2D illustrates such a hardened dielectric liner 232 formed where the original sacrificial dielectric material 226 was and where the sacrificial dielectric material 226 interfaced (i.e. was at a close proximity, preferably in contact with) the shell material 230. The bottom view of FIG. 2O illustrates with a dotted line an outline of the structure 228 covered with the shell material 230, as well as illustrates with a dashed line an outline of the structure 228 underneath. Similar to FIG. 2C, different dashed-dotted lines between the top left and the bottom views of FIG. 2D are intended to illustrate alignment of the location of the structure 228 covered with the shell material 230 and of the structure 228 itself between these two views.

In some embodiments, such a high temperature deposition of AlN may be performed by for metal organic chemical vapor deposition (MOCVD) or sputtered approaches. Similar to CVD or ALD, MOCVD is a chemical process in which one or more reactive precursor gases are introduced into a reaction chamber and directed towards a substrate in order to induce controlled chemical reactions that result in growth of a desired material on the substrate. In the chamber, a layer of solid thin film material is deposited on the surface of the substrate due to reaction of the gas/gases. What is unique to MOCVD is that one or more precursors used are metal organic (MO) precursors, such as trimethyl-aluminum. The nitrogen may be provided using either NH3 or N2 gas. The reaction to grow AlN occurs at very high temperatures (greater than 1000 degrees Celsius) which is what results in changing of the originally deposited sacrificial dielectric 226 to the hardened dielectric 232. Sputtering approach to depositing AlN may involve performing physical vapor deposition (PVD) from an aluminum target in nitrogen gas ambient. Similar to MOCVD, such sputtering may be performed at temperatures greater than 1000 degrees Celsius, resulting in formation of the hardened dielectric 232 at the interfaces where AlN is deposited on the originally deposited sacrificial dielectric 226.

While FIG. 2D and subsequent FIGS. illustrate an embodiment where the hardened dielectric 232 is formed, in other embodiments, such a hardened dielectric material does not have to be formed as long as the shell material 230 and the sacrificial dielectric material 226 are selected so that it is possible to create a cavity in the shell material 230 in a later process (process 112, described below) by removing at least some of the sacrificial dielectric material 226. Furthermore, while FIG. 2D illustrates a substantially complete coverage of the structure 228, as well as the surrounding area of the substrate 222, by the shell material 230 because such implementation may be particularly advantageous from the fabrication perspective (e.g. because it's easier to cover the entire structure 228 in a single deposition process), in other implementations the shell material 230 does not cover the structure 228 completely, i.e. the shell material 230 may have discontinuities so that there may be one or more openings in the shell material 230 encompassing the structure 228, i.e. portions of the structure 228 may be exposed through the shell material 230.

In various embodiments, the thickness of the shell material 230 provided in the process 108 may be between about 10 and 100 nm, including all values and ranges therein, e.g.

between 20 and 80 nm, or between 50 and 75 nm. On the other hand, for the embodiments when the hardened dielectric 232 is formed, a thickness of the hardened dielectric 232 may be between about 5 and 100 nm, including all values and ranges therein, e.g. between about 10 and 30 nm, or between about 15 and 20 nm.

The method 100 may then proceed with a process 110 of creating an etch opening in the shell material (and in the hardened dielectric material, in case such a material was formed) for removing at least some of the sacrificial dielectric material of the structure 228. An exemplary result of the process 110 is illustrated with a device assembly 210 shown in FIG. 2E showing an etch opening 234 in the shell material 230 and the hardened dielectric 232. The opening formed in the process 110 is not limited to the type and the location of the opening illustrated in the device assembly 210. In general, any type of opening in the shell material 230, in any location, which would allow removal of the sacrificial dielectric and, subsequently, supplying precursor gases for epitaxial deposition of III-N materials would be within the scope of the present disclosure. In various embodiments, such an opening may be created using any suitable technique which would depend on the type of the shell material (and on the type of the hardened dielectric material, in case such a material was formed). For example, in some embodiments, dry etch with e.g. chlorine (Cl2) and boron trichloride (BCl3) chemistry in reactive ion etch (RIE) process may be used to form an etch opening in the process 110. Preferably, the opening formed in the process 110 is formed away (laterally) from the III-N growth seeding opening 225 formed in the process 104 in order to promote lateral growth of the III-N material in a later process (process 114).

Figure 2F:
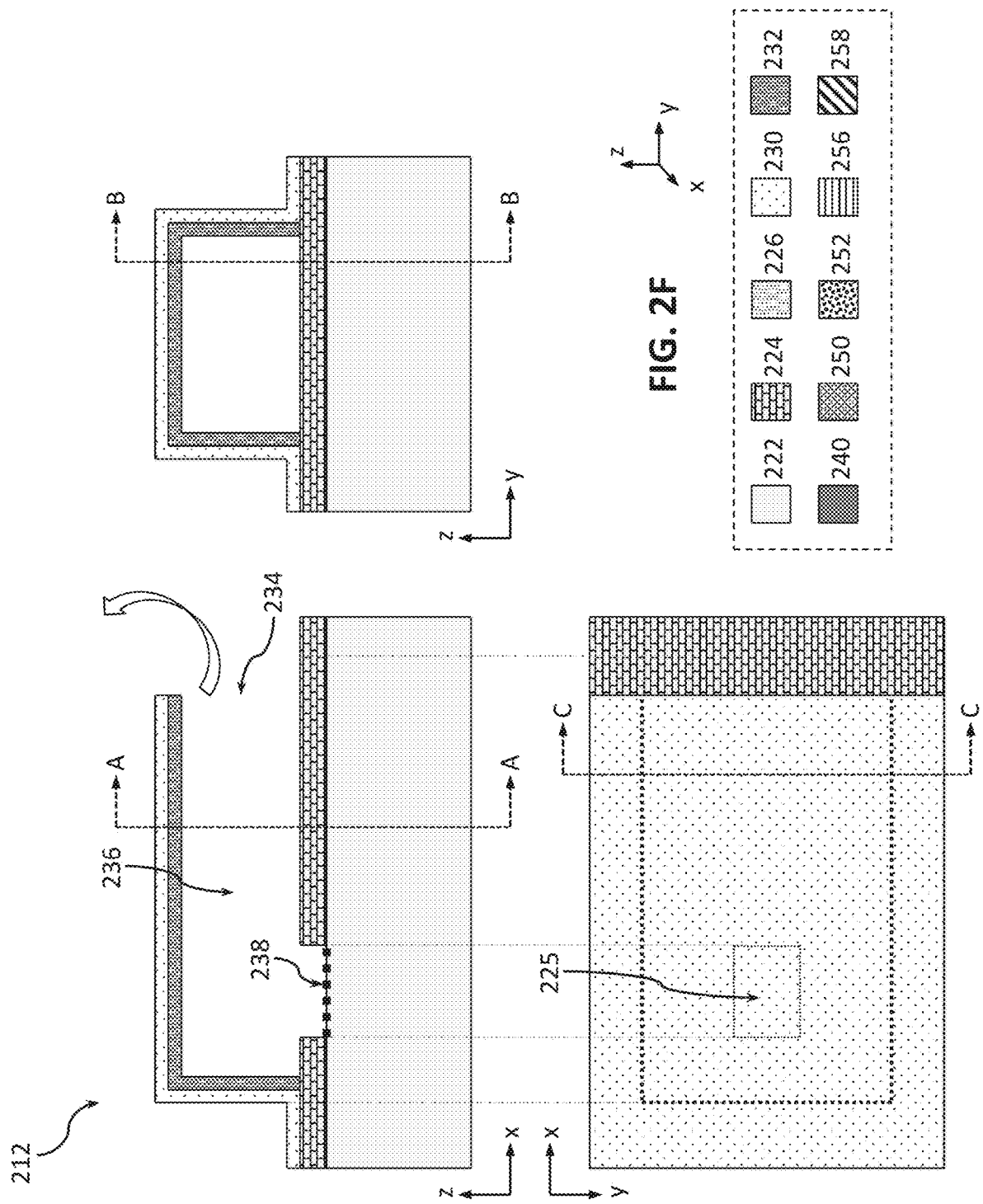

Next, the method 100 may then proceed with a process 112 of etching, via the etch opening created in the process 110, at least some of the sacrificial dielectric material 226 to form a cavity. An exemplary result of the process 112 is illustrated with a device assembly 212 shown in FIG. 2F showing all of the sacrificial dielectric material 226 removed via the etch opening 234 to form a cavity 236 in the shell material 230 and the hardened dielectric 232 (the process of removal is schematically illustrated with a large arrow shown in the top left view of FIG. 2F). In other embodiments (not specifically shown in FIGS.), some of the sacrificial dielectric material 226 may remain in the cavity 236, as long as the sacrificial dielectric material 226 is removed in the process 112 until sufficient portion of the substrate 222 is exposed in the III-N seeding opening 225 within the cavity 236 because this portion will serve to initiate epitaxial growth of the III-N material in the cavity at a later process. Such a portion of the substrate 222 shown in the top left view of FIG. 2F as a seed surface 238.

Any suitable etching techniques for removing the sacrificial dielectric material 226 through the etch opening 234 without substantially removing the III-N growth blocking layer 224, the shell material 230, or the hardened dielectric 232 may be used in the process 112. In some embodiments, the etch of the process 12 may include an isotropic etch, such as e.g. an isotropic wet etch. Isotropic etching etches in multiple directions (both vertically and horizontally), unlike e.g. dry etching which only substantially etches in a single direction, and, therefore, can be used to achieve undercutting of the sacrificial material 226 under the shell 230, thereby providing a void or a gap between the shell 230 and the III-N growth blocking layer 224, forming the cavity 236. Any substance suitable for isotropically etching the sacrificial material 226 may be used in the process 112. In various embodiments, an etchant may be e.g. corrosive liquid, such as e.g. hydrofluoric acid (HF) or a chemically active ionized gas (i.e. plasma).

Provided that substantially all of the sacrificial material 226 is etched out in the process 112, the shape and dimensions of the resulting cavity 236 will be those defined by the shell 230 and the hardened dielectric 232. In some embodiments, the cavity 236 may have a height (i.e. a dimension measured along the z-axis of the coordinate system shown in FIGS. 2A-2I) less than about 200 nm, including all values and ranges therein, e.g. between about 5 and 50 nm, or between about 10 and 20 nm, and a width (i.e. a dimension measured along the y-axis of the coordinate system shown in FIGS. 2A-2I) between about 2 and 30 nm, including all values and ranges therein, e.g. between about 3 and 20 nm, or between about 4 and 10 nm.

Figure 2G:
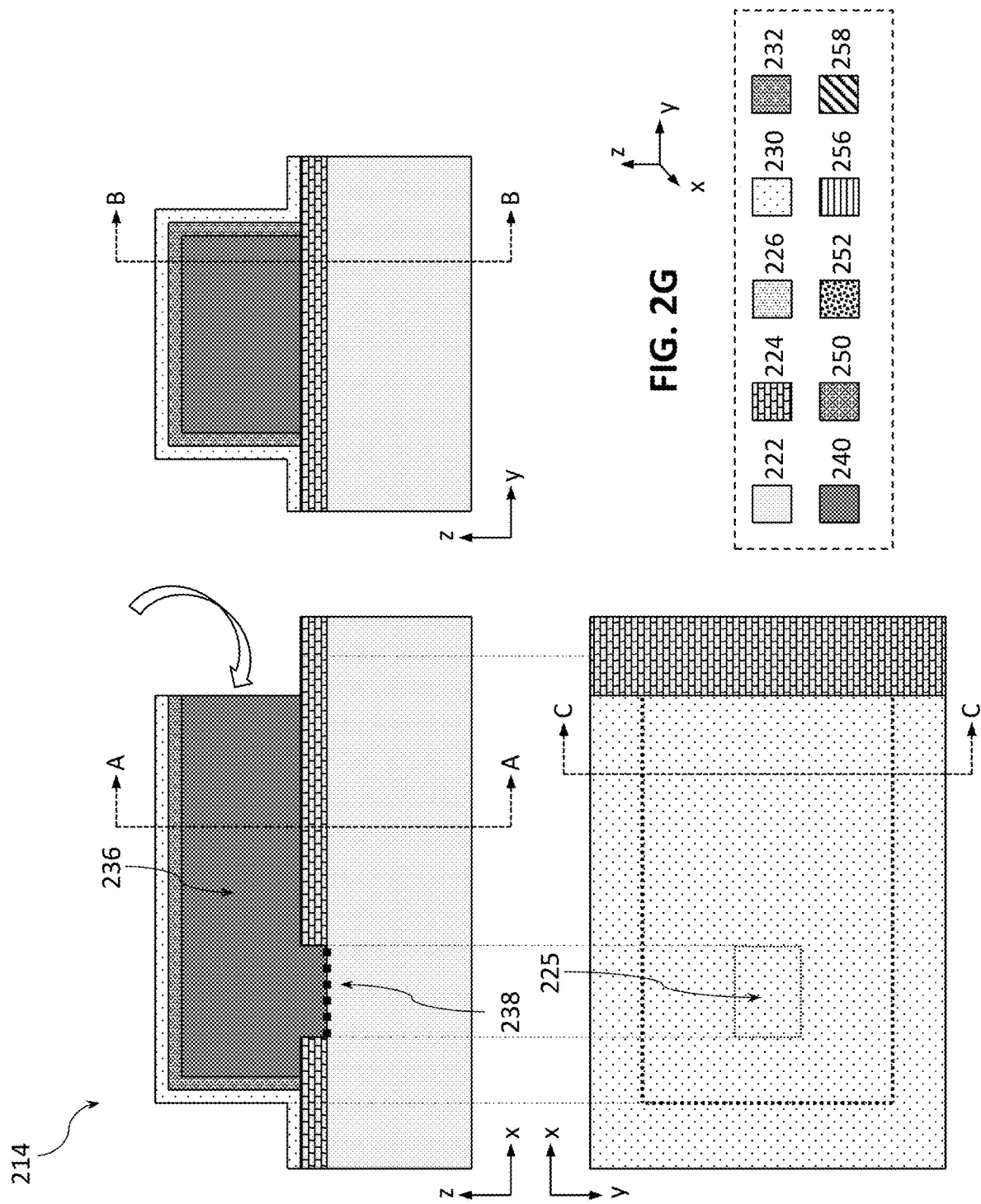

The method 100 may then proceed with a process 114 of epitaxially growing a III-N semiconductor material within the cavity formed in the process 112. An exemplary result of the process 114 is illustrated with a device assembly 214 shown in FIG. 2G showing the cavity 236 of the device assembly of FIG. 2F now being filled with a III-N semiconductor material 240 (the process of growing the III-N semiconductor material is schematically illustrated with a large arrow shown in the top left view of FIG. 2G). While FIG. 2G illustrates that all of the cavity 236 is filled with the III-N semiconductor material 240, in other embodiments (not specifically shown in FIGS.), the cavity 236 may be filled partially.

The epitaxial growth of the process 114 may be performed by providing fluid precursors for the growth of the desired III-N semiconductor material, e.g. tri-methyl-aluminum (TMA), tri-ethyl-aluminum (TEA), nitrogen, ammonia, etc., either via the opening 234 which was used for the etch in the process 112 or via a different opening formed in the shell 230 (and the hardened dielectric 232, in case it was used), not specifically shown in FIG. 2G. The epitaxial growth will start from the seed surface 238 because that's the only crystalline surface within the cavity 236 and, therefore, the only place within the cavity from which the epitaxial growth can be initiated. As precursors are continuously supplied into the cavity 236, the III-N semiconductor material 240 will start growing upwards (i.e. in the direction of the z-axis shown in the FIGS.) and then continue to grow in the lateral direction (i.e. in the direction of the x-axis shown in the FIGS.), over the III-N growth blocking layer 224, by LEO. The crystalline quality of the resulting portion of the III-N semiconductor material 240 that is grown by LEO will be higher than that of the vertically grown portion. Approximately, the LEO portion of the III-N semiconductor material 240 is the portion over the III-N growth blocking layer 224, while the vertically grown portion of the III-N semiconductor material 240 is the portion over the seed surface 238.

Provided that substantially all of the cavity 236 is filled with the III-N semiconductor material 240 in the process 114, the shape and dimensions of the resulting the III-N semiconductor material 240 will be those defined by the cavity 236. Thus, in some embodiments, the III-N semiconductor material 240 grown in the process 114 may have a height (i.e. a dimension measured along the z-axis of the coordinate system shown in FIGS. 2A-2I) less than about 200 nm, including all values and ranges therein, e.g. between about 5 and 50 nm, or between about 10 and 20 nm, and a width (i.e. a dimension measured along the y-axis of the coordinate system shown in FIGS. 2A-2I) between about 2 and 30 nm, including all values and ranges therein, e.g. between about 3 and 20 nm, or between about 4 and 10 nm.

The length (i.e. a dimension measured along the x-axis of the coordinate system shown in FIGS. 2A-2I) of the III-N semiconductor structure is also defined by the cavity 236, and could be substantially larger than the height or the width, e.g. In order to accommodate several III-N device components in a single structure, so that the resulting III-N semiconductor structure can be seen as a "wire." In various embodiments, the length of the III-N semiconductor material 240 grown in the process 114 may be between 10 and 2000 nm, including all values and ranges therein.

In general, the III-N semiconductor material 240 grown in the process 114 may be composed of semiconductor material systems including, for example, N-type or P-type materials systems. In particular, for exemplary N-type transistor embodiments, the III-N semiconductor material 240 may advantageously be a III-N material having a high electron mobility, such as, but not limited to GaN, InGaAs, InP, InSb, and InAs. For some $In_xGa_{1-x}As$ fin embodiments, In content (x) may be between about 0.6 and 0.9, and advantageously be at least about 0.7 (e.g., $In_{0.7}Ga_{0.3}As$). For some such embodiments, the III-N semiconductor material 240 may be a ternary III-N alloy, such as e.g. InGaN.

In some embodiments, the III-N semiconductor material 240 may be grown to form a highly crystalline semiconductor, e.g. of substantially a monocrystalline semiconductor. In some embodiments, the III-N semiconductor material 240 may be grown to form a compound semiconductor with a first sub-lattice of at least one element from group ill of the periodic table (e.g., Al, Ga, In), and a second sub-lattice of nitrogen. In some embodiments, the III-N semiconductor material 240 may be a binary, ternary, or quaternary III-N compound semiconductor that is an alloy of two, three, or even four elements from group III of the periodic table and nitrogen.

In some embodiments, the III-N semiconductor material 240 may be an intrinsic III-N semiconductor material or alloy, not intentionally doped with any electrically active impurity. In alternate embodiments, one or more a nominal impurity dopant level may be added to the III-N semiconductor material 240 during the epitaxial growth of the process 114, for example to set a threshold voltage lit, or to provide HALO pocket implants, etc. In other embodiments, the III_N semiconductor material 240 may be doped at a later process (e.g. after the shell material is removed in process 116), e.g. using dopant ion implantation. In all such impurity-doped embodiments of the III-N semiconductor material 240 however, impurity dopant level within the III-N semiconductor material 240 may be relatively low, for example below $10^{15}$ atoms per cubic centimeter (atoms-cm$^-$3) and advantageously below $10^{13}$ atoms-cm$^{-3}$.

The method 100 may then proceed with a process 116 of removing the shell material 230 around the III-N semiconductor material 240 grown the process 112. The hardened dielectric 232 may be removed as well. An exemplary result of the process 116 is illustrated with a device assembly 216 shown in FIG. 2H showing a structure 242 of the III-N semiconductor material 240 remaining after the shell material 230 and the hardened dielectric 232 are removed. In various embodiments, the shell material 230 and the hardened dielectric 232 may be removed using wet etch, dry etch, or a suitable combination of wet etch and dry etch. For example, a wet etch can be performed using potassium hydroxide (KOHL tetramethylammonium hydroxide (TMAH) or hydrofluoric acid (HF) based chemistries, while dry etch can be performed using chlorine gas (e.g. Cl2), and boron trichloride (BCl3) type chemistries in reactive ion etching (RIE).

The III-N structure 242 would have the dimensions substantially as those described for the III-N semiconductor material 240 grown in the process 114. Since a portion of the III-N structure 242 is provided over the III-N growth blocking layer 224 (substantially by LEO) while a portion is provided over and in the seeding opening 225, the height of the latter portion of the III-N structure 242 is a sum of that of the former portion and the thickness of the III-N growth blocking layer 224.

Finally, in a process 118 of the method 100, one or more III-N device components may be formed using the III-N structure 242 as the active material. An exemplary result of the process 118 is illustrated with a device assembly 218 shown in FG. 2I showing a III-N transistor 246 as an example of a III-N device component, with a portion of the III-N structure 242 used as a channel material of the transistor.

Figure 2I:
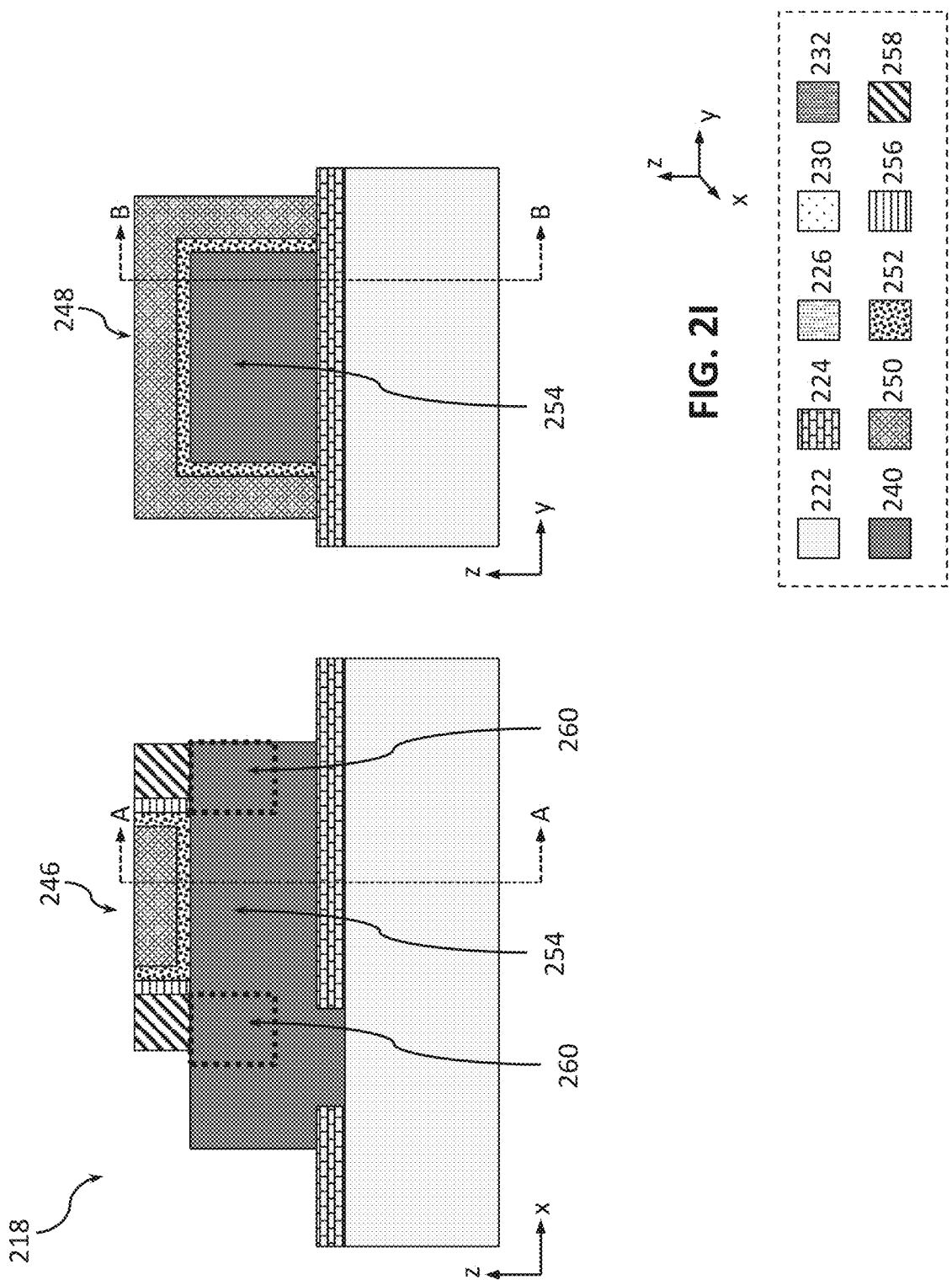

As shown in FIG. 2I, an exemplary transistor 246 may include a gate stack 248 comprising a gate electrode material 250 (which could include a stack of one or more gate electrode materials) and a gate dielectric 252 (which could include a stack of one or more gate dielectric materials). In some embodiments, the gate stack 248 may wrap around the III-N structure 242 as shown in FIG. 2I, with a channel portion 254 of the transistor corresponding to the portion of the III-N semiconductor material 240 of the III-N structure 242 wrapped by the gate stack 248. In particular, the gate dielectric 252 may wrap around the portion of the III-N semiconductor material 240 of the III-N structure 242, and the gate electrode material 250 may wrap around the gate dielectric 252.

The gate electrode material 250 may include at least one P-type work function metal or N-type work function metal, depending on whether the transistor 246 is a P-type metal oxide semiconductor (PMOS) transistor or an N-type metal oxide semiconductor (NMOS) transistor (P-type work function metal used as the gate electrode 250 when the transistors 246 is a PMOS transistor and N-type work function metal used as the gate electrode 250 when the transistor 246 is an NMOS transistor). For a PMOS transistor, metals that may be used for the gate electrode material 250 may include, but are not limited to, ruthenium, palladium, platinum, cobalt, nickel, and conductive metal oxides (e.g., ruthenium oxide). A P-type metal layer will enable the formation of a PMOS gate electrode with a workfunction that is between about 4.9 eV and about 5.2 eV. For an NMOS transistor, metals that may be used for the gate electrode material 250 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). An N-type metal layer will enable the formation of an NMOS gate electrode with a workfunction that is between about 3.9 eV and about 4.2 eV. In some embodiments, the gate electrode material 250 may include a stack of two or more metal layers, where one or more metal layers are work function metal layers and at least one metal layer is a fill metal layer. Further layers (not specifically shown in the FIGS.) may be included next to the gate electrode material 250 for other purposes, such as to act as a diffusion barrier layer or/and an adhesion layer.

In some embodiments, the gate dielectric 252 may include one or more high-k dielectrics including any of the high-k dielectric materials discussed herein with reference to the III-N growth blocking layer 224. The high-k dielectric 252 may include elements such as hafnium, silicon, oxygen, titanium, tantalum, lanthanum, aluminum, zirconium, barium, strontium, yttrium, lead, scandium, niobium, and zinc. Examples of high-k materials that may be used in the high-k dielectric 252 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the high-k dielectric 252 during manufacture of the gate stack 248 to improve the quality of the high-k dielectric 252. The high-k dielectric 252 may have a thickness (i.e. a dimension measured along the z-axis of the coordinate system shown in FIGS. 2A-2I) between 0.5 and 8 nm, including all values and ranges therein. In some embodiments, an annealing process may be carried out on the gate dielectric 252 during manufacture of the transistor 246 to improve the quality of the gate dielectric 252.

In some embodiments, a polarization layer (not specifically shown in FIGS.) may be provided over the III-N material 240 before the gate stack 248 is formed. As described above, a polarization layer is a charge-inducing film of a material having larger spontaneous and piezoelectric polarization than that of the bulk (i.e. the rest) of the III-N material 240, creating a hetero-interface with the bulk portion of the III-N material 240 and leading to formation of 2DEG at that interface. In various embodiments, such a polarization layer may include materials such as e.g. AlN, InAlN, or AlGaN, and may have a thickness (i.e. a dimension measured along the z-axis of the coordinate system shown in FIGS. 2A-2I) between about 2 and 30 nm, including all values and ranges therein e.g. between about 5 and 15 nm.

As also shown in FIG. 2I, in some embodiments, the gate stack 248 may be surrounded by a gate spacer 256. The gate spacer 256 is configured to provide separation between the gate stacks 248 of different transistors (different transistors not specifically shown in FIG. 2I) provided along a single III-N structure 242, as well as between the gate stack 248 and the source/drain contacts 258 disposed on each side of the gate stack 248. The gate spacer 256 is typically made of a low-k dielectric material (i.e. a dielectric material that has a lower dielectric constant (k) than silicon dioxide), including any of the low-k dielectric materials discussed herein with reference to the III-N growth blocking layer 224. Example of the low-k dielectric materials that may be used as the gate spacer 256 include, but are not limited to, silicon dioxide, carbon-doped oxide, silicon nitride, organic polymers such as perfluorocyclobutane or polytetrafluoroethylene, FSG, and organosilicates such as silsesquioxane, siloxane, or organosilicate glass. The gate spacer 256 may include pores or air gaps to further reduce its dielectric constant.

As also shown in FIG. 2I, source/drain (S/D) contacts/terminals 258 are provided on either side of the gate stack 248, thus realizing a transistor. One or more layers of electrically conductive materials such as e.g. metal and/or metal alloys are typically used to form the S/D contacts 258. Also not specifically shown in FIG. 2I, a spacer material such as the gate spacer 256 may be provided on either side of the S/D contacts 258.

The S/D contacts 258 are connected to individual highly doped regions 260 (indicated in FIG. 2I with dashed line contours shown in the top let view) separated by the channel portion 254 of the III-N semiconductor material 240. The S/D regions 260 can be either P-type or N-type, as long as they are of the same type and of opposite type to the channel portion. In various embodiments, the S/D regions 260 may generally be formed using either an implantation/diffusion process or an etching/deposition process. In the former process, dopants such as boron, aluminum, antimony, phosphorous, or arsenic may be ion-implanted into the respective portions of the III-N semiconductor material 240 to form the S/D regions 260. An annealing process that activates the dopants and causes them to diffuse further into the III-N semiconductor material 240 typically follows the ion implantation process. In the latter process, the semiconductor material 240 may first be removed to form recesses at the locations of the source and drain regions. An epitaxial deposition process may then be carried out to fill the recesses with material that is used to fabricate the S/D regions 260. In some implementations, the epitaxially deposited S/D region material may be doped in situ with dopants such as boron, arsenic, or phosphorous.

The transistor 246 may have a gate length, i.e. a distance between the source region 260 and the drain region 260 of the transistor 246 (i.e. a dimension measured along the x-axis of the coordinate system shown in FIGS. 2A-2I), which may, in some embodiments, be below about 250 nm, including all values and ranges therein, e.& between about 10 and 250 nm, e.g. between about 35 and 90 nm, or between about 35 and 50 nm. Because of the non-planar architecture of the III-N structure 242 which provides a foundation the transistor 246, in operation, the transistor 246 may form conducting channels on three "sides" of the III-N structure 242, potentially improving performance relative to single-gate transistors (which may form conducting channels on one "side" of a channel material) and double-gate transistors (which may form conducting channels on two "sides" of a channel material).

In other embodiments (not specifically illustrated in FIG. 2I), device components other than transistors, transistors other than the one illustrated in FIG. 2I, or multiple device components may be provided along the III-N structure 242.

The III-N device assemblies illustrated in FIGS. 2A-2I do not represent an exhaustive set of assemblies in which III-N nanostructures formed using a cavity fill method as described herein may be implemented, but merely provide examples of such structures/assemblies. Although particular arrangements of materials are discussed with reference to FIGS. 2A-2I, intermediate materials may be included in the assemblies of these FIGS. Note that FIGS. 2A-2I are intended to show relative arrangements of the elements therein, and that III-N device assemblies of these FIGS. may include other elements that are not specifically illustrated (e.g., various interfacial layers). Additionally, although some elements of the III-N device assemblies are illustrated in FIGS. 2A-2I as being planar rectangles or formed of rectangular solids, this is simply for ease of illustration, and embodiments of these assemblies may be curved, rounded, or otherwise irregularly shaped as dictated by, and sometimes inevitable due to, the manufacturing processes used to fabricate semiconductor device assemblies.

Inspection of layout and mask data and reverse engineering of parts of a device to reconstruct the circuit using e.g. optical microscopy, TEM, or SEM, and/or inspection of a cross-section of a device to detect the shape and the location of various device elements described herein using e.g. Physical Failure Analysis (PFA) would allow determination of the III-N nanostructures formed using a cavity fill method as described herein.

The III-N device assemblies having one or more III-N nanostructures formed via cavity fill as disclosed herein may be included in any suitable electronic device. FIGS. 3A-6 illustrate various examples of apparatuses that may include one or more III-N semiconductor device assemblies implementing III-N nanostructures formed using a cavity fill method, as disclosed herein.

Figure 3B:
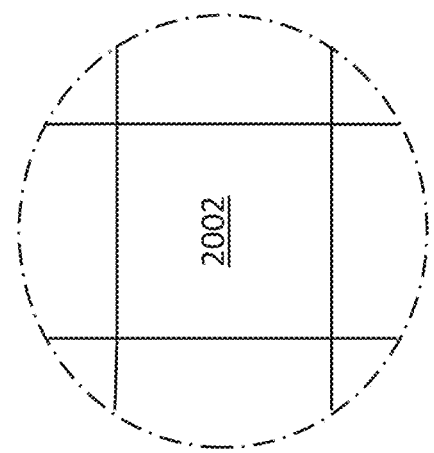
FIGS. 3A and 3B are top views of a wafer and dies that include one or more III-N semiconductor device assemblies having III-N nanostructures formed via cavity fill in accordance with any of the embodiments disclosed herein.
Figure 3A:
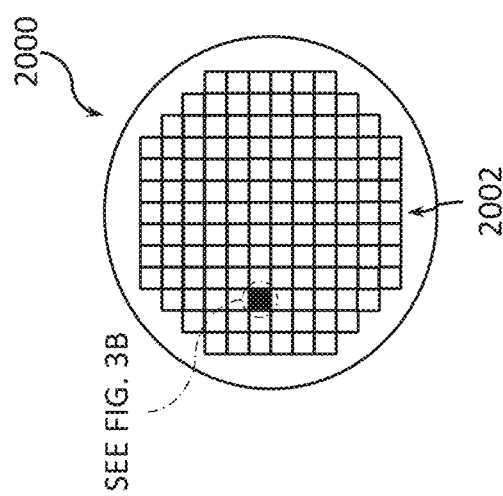

FIGS. 3A-3B are top views of a wafer 2000 and dies 2002 that may include one or more III-N semiconductor device assemblies implementing III-N nanostructures formed using a cavity fill method in accordance with any of the embodiments disclosed herein. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more III-N structures 242 or/and one or more III device assemblies 218, or any other components where III-N nanostructures may be formed using a cavity fill method as described herein). After the fabrication of the semiconductor product is complete (e.g., after manufacture of III-N structures 242 or/and one or more III device assemblies 218, or any other components where III-N nanostructures may be formed using a cavity fill method as described herein), the wafer 2000 may undergo a singulation process in which each of the dies 2002 is separated from one another to provide discrete "chips" of the semiconductor product. In particular, devices that include one or more III-N semiconductor device assemblies implementing III-N nanostructures formed using a cavity fill method as disclosed herein may take the form of the wafer 2000 (e.g., not singulated) or the form of the die 2002 (e.g., singulated). The die 2002 may include one or more transistors (e.g., one or more of the transistors 2140 of FIG. 4, discussed below, which may take the form of any of the transistors which may be formed based on the III-N nanostructures formed using a cavity fill method as described herein) and/or supporting circuitry to route electrical signals to the transistors, as well as any other IC components. In some embodiments, the wafer 2000 or the die 2002 may include a memory device (e.g., a static random access memory (SRAM) device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device e.g., the processing device 2302 of FIG. 6) or other logic that is configured to store information in the memory devices or execute instructions stored in the memory array.

Figure 4:
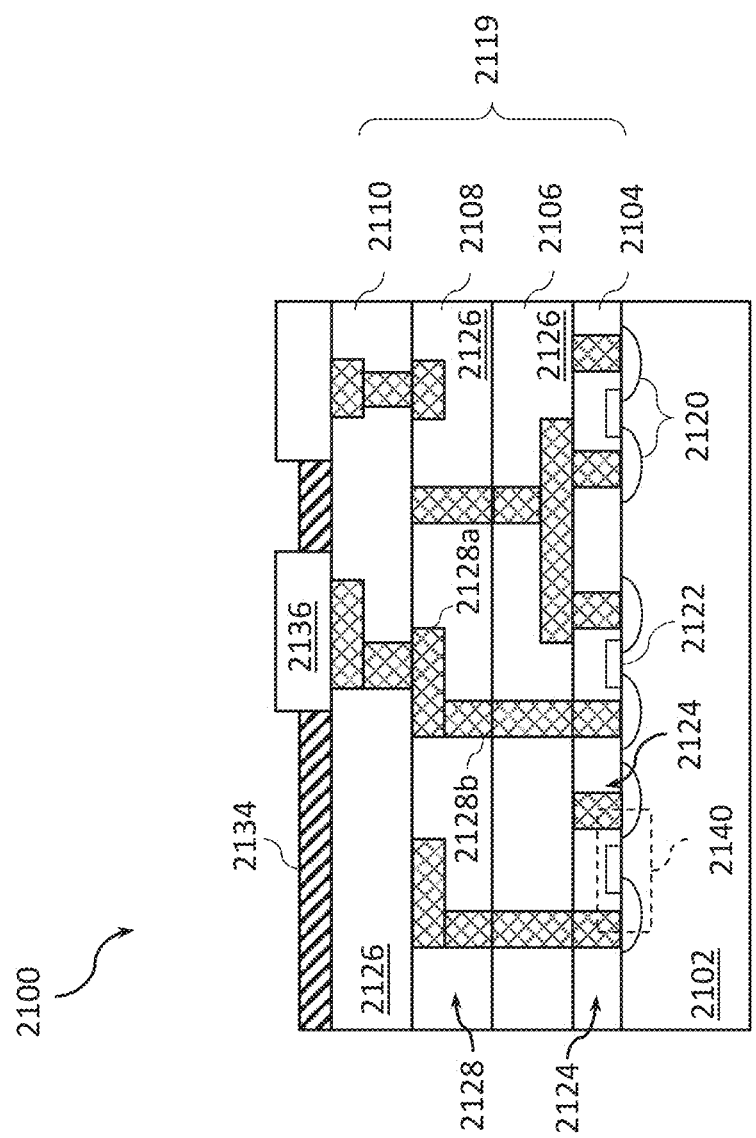
FIG. 4 is a cross-sectional side view of an integrated circuit (IC) device that may include one or more III-N semiconductor device assemblies having III-N nanostructures formed via cavity fill in accordance with any of the embodiments disclosed herein.

FIG. 4 is a cross-sectional side view of an IC device 2100 that may include one or more III-N semiconductor device assemblies having III-N nanostructures formed via cavity fill in accordance with any of the embodiments disclosed herein. The IC device 2100 may be formed on a substrate 2102 (e.g., the wafer 2000 of FIG. 3A) and may be included in a die (e.g., the die 2002 of FIG. 33). The substrate 2102 may be a semiconductor substrate composed of semiconductor material systems including, for example, N-type or P-type materials systems. The substrate 2102 may include, for example, a crystalline substrate formed using a bulk silicon or a silicon-on-insulator substructure. In some embodiments, the semiconductor substrate 2102 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, or IV may also be used to form the substrate 2102. Although a few examples of materials from which the substrate 2102 may be formed are described here, any material that may serve as a foundation for an IC device 2100 may be used. The substrate 2102 may be part of a singulated die (e.g., the dies 2002 of FIG. 33) or a wafer (e.g., the wafer 2000 of FIG. 3A).

The IC device 2100 may include one or more device layers 2104 disposed on the substrate 2102. The device layer 2104 may include features of one or more transistors 2140 (e.g., metal oxide semiconductor field-effect transistors (MOSFETs)) formed on the substrate 2102. The device layer 2104 may include, for example, one or more source and/or drain (S/D) regions 2120, a gate 2122 to control current flow in the transistors 2140 between the S/D regions 2120, and one or more S/D contacts 2124 to route electrical signals to/from the S/D regions 2120. Although not specifically shown in FIG. 4, the transistors 2140 may implement III-N nanostructures formed using a cavity fill method as described herein, e.g. as described with reference to the III-N device assemblies 214-218. The S/D regions 2120 may be formed either adjacent to or at a distance from the gate 2122 of each transistor 2140, using any suitable processes known in the art, some of which are described above. The transistors 2140 may include additional features not depicted for the sake of clarity, such as additional device isolation regions, gate contacts, and the like. The transistors 2140 are not limited to the type and configuration depicted in FIG. 4 and may include a wide variety of other types and configurations such as, for example, planar transistors, non-planar transistors, or a combination of both. Non-planar transistors may include FinFET transistors, such as double-gate transistors or FinFETs, and wrap-around or all-around gate transistors, such as nanoribbon and nanowire transistors.

Each transistor 2140 may include a gate 2122 formed of at least two layers, a gate dielectric layer and a gate electrode layer, as described above with reference to the III-N device assembly 218.

In some embodiments, when viewed as a cross-section of the transistor 2140 along the source-channel-drain direction, the gate electrode may include a U-shaped structure that includes a bottom portion substantially parallel to the surface of the substrate and two sidewall portions that are substantially perpendicular to the top surface of the substrate (e.g., in a FinFET). In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

Electrical signals, such as power and/or input/output (I/O) signals, may be routed to and/or from the transistors 2140 of the device layer 2104 through one or more interconnect layers disposed on the device layer 2104 (illustrated in HG. 4 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an interlayer dielectric (ILD) stack 2119 of the IC device 2100.

The interconnect structures 2128 may be arranged within the interconnect layers 2106-2110 to route electrical signals according to a wide variety of designs (in particular, the arrangement is not limited to the particular configuration of interconnect structures 2128 depicted in FIG. 4). Although a particular number of interconnect layers 2106-2210 is depicted in FIG. 4, embodiments of the present disclosure include IC devices having more or fewer interconnect layers than depicted.

In some embodiments, the interconnect structures 2128 may include trench structures 2128a (sometimes referred to as "lines") and/or via structures 2128b (sometimes referred to as "holes") filled with an electrically conductive material such as a metal. The trench structures 2128a may be arranged to route electrical signals in a direction of a plane that is substantially parallel with a surface of the substrate 2102 upon which the device layer 2104 is formed. For example, the trench structures 2128a may route electrical signals in a direction in and out of the page from the perspective of FIG. 4. The via structures 2128b may be arranged to route electrical signals in a direction of a plane that is substantially perpendicular to the surface of the substrate 2102 upon which the device layer 2104 is formed. In some embodiments, the via structures 2128b may electrically couple trench structures 2128a of different interconnect layers 2106-2110 together.

The interconnect layers 2106-2110 may include a dielectric material 2126 disposed between the interconnect structures 2128, as shown in FIG. 4. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same.

A first interconnect layer 2106 (referred to as Metal 1 or "M1") may be formed directly on the device layer 2104. In some embodiments, the first interconnect layer 2106 may include trench structures 2128a and/or via structures 2128b, as shown. The trench structures 2128a of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128h to couple the trench structures 2128a of the second interconnect layer 2108 with the trench structures 2128a of the first interconnect layer 2106. Although the trench structures 2128a and the via structures 2128b are structurally delineated with a line within each interconnect layer (e.g., within the second interconnect layer 2108) for the sake of clarity, the trench structures 2128a and the via structures 2128b may be structurally and/or materially contiguous (e.g., simultaneously filled during a dual-damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The IC device 2100 may include a solder resist material 2134 (e.g., polyimide or similar material) and one or more bond pads 2136 formed on the interconnect layers 2106-2110. The bond pads 2136 may be electrically coupled with the interconnect structures 2128 and configured to route the electrical signals of the transistor(s) 2140 to other external devices. For example, solder bonds may be formed on the one or more bond pads 2136 to mechanically and/or electrically couple a chip including the IC device 2100 with another component (e.g., a circuit board). The IC device 2100 may have other alternative configurations to route the electrical signals from the interconnect layers 2106-2110 than depicted in other embodiments. For example, the bond pads 2136 may be replaced by or may further include other analogous features (e.g., posts) that route the electrical signals to external components.

Figure 5:
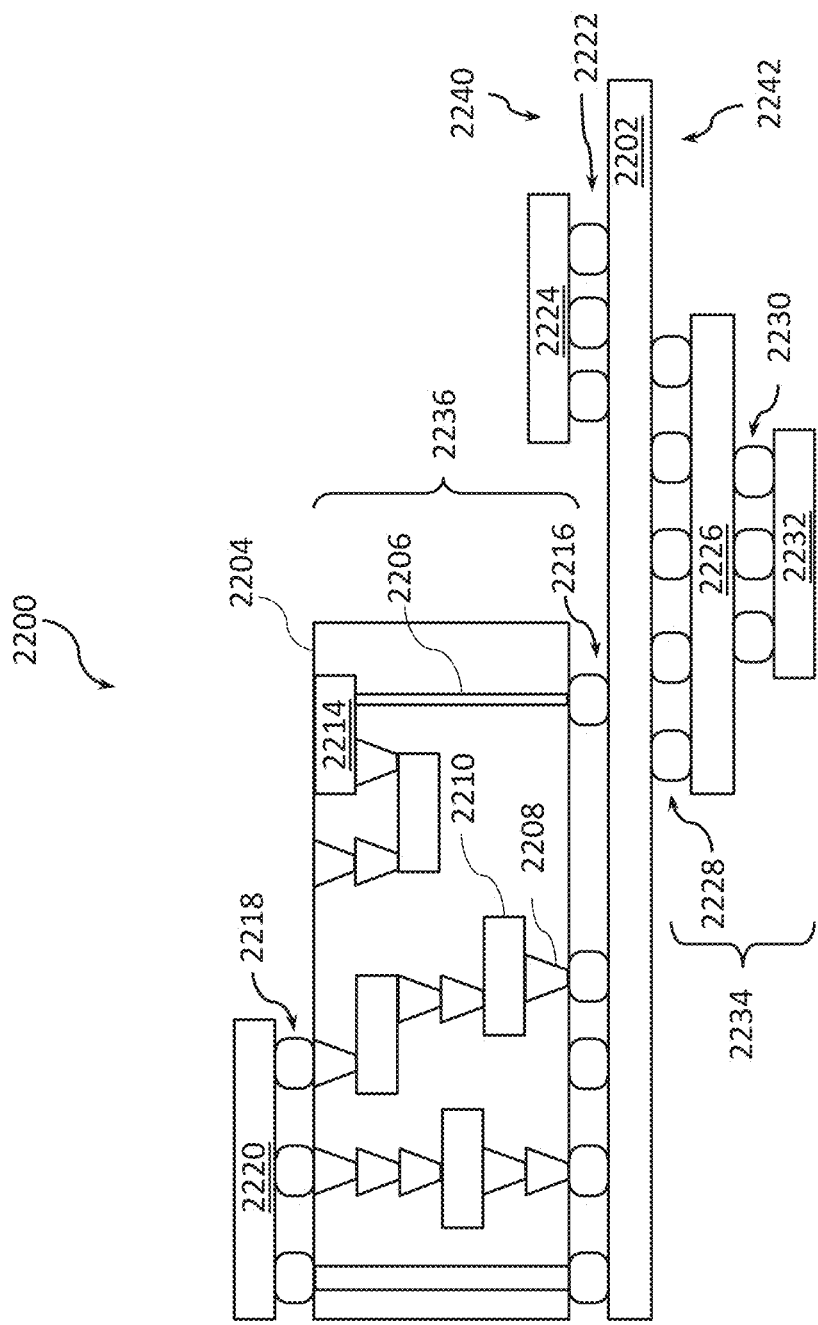
FIG. 5 is a cross-sectional side view of an IC device assembly that may include one or more III-N semiconductor device assemblies having III-N nanostructures formed via cavity fill in accordance with any of the embodiments disclosed herein.

FIG. 5 is a cross-sectional side view of an IC device assembly 2200 that may include one or more III-N semiconductor device assemblies having III-N nanostructures formed via cavity fill in accordance with any of the embodiments disclosed herein. The IC device assembly 2200 includes a number of components disposed on a circuit board 2202 (which may be, e.g., a motherboard). The IC device assembly 2200 includes components disposed on a first face 2240 of the circuit board 2202 and an opposing second face 2242 of the circuit board 2202; generally, components may be disposed on one or both faces 2240 and 2242. In particular, any suitable ones of the components of the IC device assembly 2200 may include any of the III-N semiconductor device assemblies implementing III-N nanostructures formed using a cavity fill method in accordance with any of the embodiments disclosed herein.

In some embodiments, the circuit board 2202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2202. In other embodiments, the circuit board 2202 may be a non-PCB substrate.

The IC device assembly 2200 illustrated in FIG. 5 includes a package-on-interposer structure 2236 coupled to the first face 2240 of the circuit board 2202 by coupling components 2216. The coupling components 2216 may electrically and mechanically couple the package-on-interposer structure 2236 to the circuit board 2202, and may include solder balls (as shown in FIG. 5), male and female portions of a socket, an adhesive, an underfill material, and/or any other suitable electrical and/or mechanical coupling structure.

The package-on-interposer structure 2236 may include an IC package 2220 coupled to an interposer 2204 by coupling components 2218. The coupling components 2218 may take any suitable form for the application, such as the forms discussed above with reference to the coupling components 2216. Although a single IC package 2220 is shown in FIG. 5, multiple IC packages may be coupled to the interposer 2204; indeed, additional interposers may be coupled to the interposer 2204. The interposer 2204 may provide an intervening substrate used to bridge the circuit board 2202 and the IC package 2220. The IC package 2220 may be or include, for example, a die (the die 2002 of FIG. 3B), an IC device (e.g., the IC device 2100 of FIG. 4), or any other suitable component. Generally, the interposer 2204 may spread a connection to a wider pitch or reroute a connection to a different connection. For example, the interposer 2204 may couple the IC package 2220 (e.g., a die) to a ball grid array (BGA) of the coupling components 2216 for coupling to the circuit board 2202. In the embodiment illustrated in FIG. 5, the IC package 2220 and the circuit board 2202 are attached to opposing sides of the interposer 2204; in other embodiments, the IC package 2220 and the circuit board 2202 may be attached to a same side of the interposer 2204. In some embodiments, three or more components may be interconnected by way of the interposer 2204.

The interposer 2204 may be formed of an epoxy resin, a fiberglass-reinforced epoxy resin, a ceramic material, or a polymer material such as polyimide. In some implementations, the interposer 2204 may be formed of alternate rigid or flexible materials that may include the same materials described above for use in a semiconductor substrate, such as silicon, germanium, and other group III-V and group IV materials. The interposer 2204 may include metal interconnects 2208 and vias 2210, including but not limited to through-silicon vias (TSVs) 2206. The interposer 2204 may further include embedded devices 2214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 2204. The package-on-interposer structure 2236 may take the form of any of the package-on-interposer structures known in the art.

The IC device assembly 2200 may include an IC package 2224 coupled to the first face 2240 of the circuit board 2202 by coupling components 2222. The coupling components 2222 may take the form of any of the embodiments discussed above with reference to the coupling components 2216, and the IC package 2224 may take the form of any of the embodiments discussed above with reference to the IC package 2220.

The IC device assembly 2200 illustrated in FIG. 5 includes a package-on-package structure 2234 coupled to the second face 2242 of the circuit board 2202 by coupling components 2228. The package-on-package structure 2234 may include an IC package 2226 and an IC package 2232 coupled together by coupling components 2230 such that the IC package 2226 is disposed between the circuit board 2202 and the IC package 2232. The coupling components 2228 and 2230 may take the form of any of the embodiments of the coupling components 2216 discussed above, and the IC packages 2226 and 2232 may take the form of any of the embodiments of the IC package 2220 discussed above. The package-on-package structure 2234 may be configured in accordance with any of the package-on-package structures known in the art.

Figure 6:
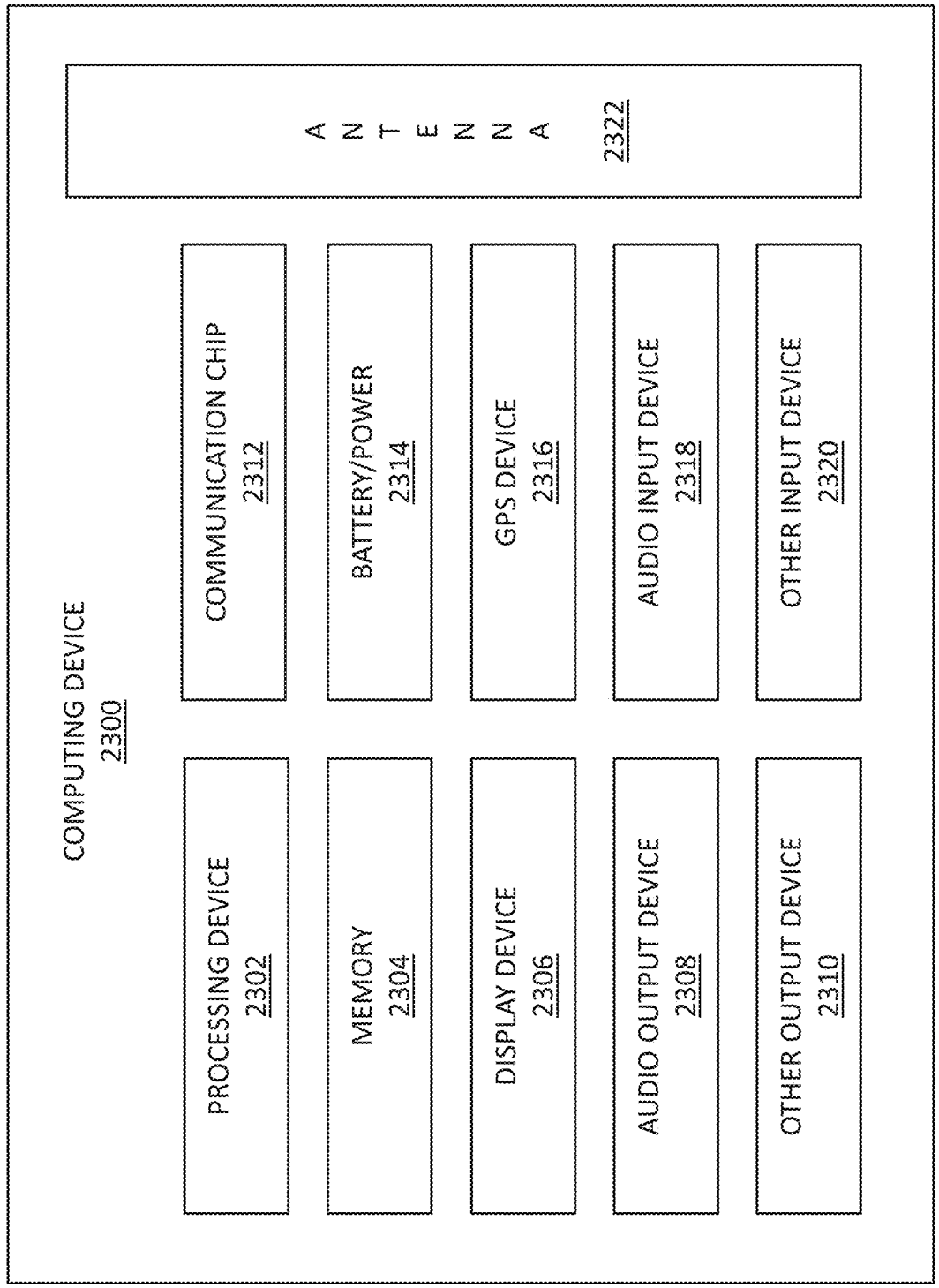
FIG. 6 is a block diagram of an exemplary computing device that may include one or more III-N semiconductor device assemblies having III-N nanostructures formed via cavity fill in accordance with any of the embodiments disclosed herein.

FIG. 6 is a block diagram of an example computing device 2300 that may include one or more III-N semiconductor device assemblies implementing III-N nanostructures formed using a cavity fill method in accordance with any of the embodiments disclosed herein. For example, any suitable ones of the components of the computing device 2300 may include a die (e.g., the die 2002 shown in FIG. 39) having III-N device components, such as e.g. transistors, which use III-N nanostructures formed using a cavity fill method in accordance with any of the embodiments disclosed herein. Any one or more of the components of the computing device 2300 may include, or be included in, an IC device 2100 (FIG. 4). Any one or more of the components of the computing device 2300 may include, or be included in, an IC device assembly 2200 (FIG. 5).

A number of components are illustrated in FIG. 6 as included in the computing device 2300, but any one or more of these components may be omitted or duplicated, as suitable for the application. In some embodiments, some or all of the components included in the computing device 2300 may be attached to one or more motherboards. In some embodiments, some or all of these components are fabricated onto a single SoC die.

Additionally, in various embodiments, the computing device 2300 may not include one or more of the components illustrated in FIG. 6, but the computing device 2300 may include interface circuitry for coupling to the one or more components. For example, the computing device 2300 may not include a display device 2306, but may include display device interface circuitry (e.g., a connector and driver circuitry) to which a display device 2306 may be coupled. In another set of examples, the computing device 2300 may not include an audio input device 2318 or an audio output device 2308, but may include audio input or output device interface circuitry (e.g., connectors and supporting circuitry) to which an audio input device 2318 or audio output device 2308 may be coupled.

The computing device 2300 may include a processing device 2302 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2302 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2300 may include a memory 2304, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the memory 2304 may include memory that shares a die with the processing device 2302. This memory may be used as cache memory and may include embedded dynamic random access memory (eDRAM) or spin transfer torque magnetic random access memory (STT-MRAM).

In some embodiments, the computing device 2300 may include a communication chip 2312 (e.g., one or more communication chips). For example, the communication chip 2312 may be configured for managing wireless communications for the transfer of data to and from the computing device 2300. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WIMAX networks, an acronym that stands for Worldwide Interoperability for Microwave Access, which is a certification mark for products that pass conformity and interoperability tests for the IEEE 802.16 standards. The communication chip 2312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2312 may operate in accordance with Code Division Multiple Access (CDMA), Time Division Multiple Access (TDMA), Digital Enhanced Cordless Telecommunications (DECT), Evolution-Data optimized (EV-DO), and derivatives thereof, as well as any other wireless protocols that are designated as 3G, 4G, 5G, and beyond. The communication chip 2312 may operate in accordance with other wireless protocols in other embodiments. The computing device 2300 may include an antenna 2322 to facilitate wireless communications and/or to receive other wireless communications (such as AM or FM radio transmissions).

In some embodiments, the communication chip 2312 may manage wired communications, such as electrical, optical, or any other suitable communication protocols (e.g., the Ethernet). As noted above, the communication chip 2312 may include multiple communication chips. For instance, a first communication chip 2312 may be dedicated to shorter-range wireless communications such as Wi-Fi or Bluetooth, and a second communication chip 2312 may be dedicated to longer-range wireless communications such as global positioning system (GPS), EDGE, GPRS, CDMA, WiMAX, LTE, EV-DO, or others. In some embodiments, a first communication chip 2312 may be dedicated to wireless communications, and a second communication chip 2312 may be dedicated to wired communications.

The computing device 2300 may include battery/power circuitry 2314. The battery/power circuitry 2314 may include one or more energy storage devices (e.g., batteries or capacitors) and/or circuitry for coupling components of the computing device 2300 to an energy source separate from the computing device 2300 (e.g., AC line power).

The computing device 2300 may include a display device 2306 (or corresponding interface circuitry, as discussed above). The display device 2306 may include any visual indicators, such as a heads-up display, a computer monitor, a projector, a touchscreen display, a liquid crystal display (LCD), a light-emitting diode display, or a flat panel display, for example.

The computing device 2300 may include an audio output device 2308 (or corresponding interface circuitry, as discussed above). The audio output device 2308 may include any device that generates an audible indicator, such as speakers, headsets, or earbuds, for example.

The computing device 2300 may include an audio input device 2318 (or corresponding interface circuitry, as discussed above). The audio input device 2318 may include any device that generates a signal representative of a sound, such as microphones, microphone arrays, or digital instruments (e.g., instruments having a musical instrument digital interface (MIDI) output).

The computing device 2300 may include a GPS device 2316 (or corresponding interface circuitry, as discussed above). The GPS device 2316 may be in communication with a satellite-based system and may receive a location of the computing device 2300, as known in the art.

The computing device 2300 may include an other output device 2310 (or corresponding interface circuitry, as discussed above). Examples of the other output device 2310 may include an audio codec, a video codec, a printer, a wired or wireless transmitter for providing information to other devices, or an additional storage device.

The computing device 2300 may include an other input device 2320 (or corresponding interface circuitry, as discussed above). Examples of the other input device 2320 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2300 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2300 may be any other electronic device that processes data.

The following paragraphs provide various examples of the embodiments disclosed herein.

Example 1 provides a III-N semiconductor device assembly. The assembly includes a substrate; a dielectric layer (e.g. the layer described herein as the "III-N growth blocking layer") of a dielectric material provided over a portion of the substrate; and a III-N structure of a III-N semiconductor material provided over the substrate. At least a portion of the III-N structure is provided over at least a portion of the dielectric layer and has a height less than about 200 nm, e.g. between about 5 and 50 nm, or between about 10 and 20 nm.

Example 2 provides the III-N semiconductor device assembly according to Example 1, where the dielectric material of the dielectric layer provided over the substrate is a first dielectric material, and at least a portion of the III-N structure is at least partially enclosed by a second dielectric material, e.g. the hardened dielectric material as described herein.

Example 3 provides the semiconductor device assembly according to Example 2, where the second dielectric material includes one or more of a compound including silicon and oxygen (e.g. $SiO_2$), a compound including silicon and nitrogen (e.g. SiN), a compound including silicon, oxygen, and nitrogen (e.g. SiON), a compound including aluminum and oxygen (e.g. $Al_2O_3$), a compound including hafnium and oxygen (e.g. HfO2), and a compound including aluminum, hafnium, and oxygen (e.g. AlHfO).

Example 4 provides the III-N semiconductor device assembly according to Examples 2 or 3, where a thickness of the second dielectric material is between about 5 and 100 nm, e.g. between 10 and 30 nm, or between 15 and 20 nm.

Example 5 provides the semiconductor device assembly according to any one of Examples 2-4, where the second dielectric material is at least partially enclosed by a material including aluminum and nitrogen, e.g. by aluminum nitride (AlN).

Example 6 provides the semiconductor device assembly according to Example 5, where a thickness of the material including aluminum and nitrogen is between 10 and 100 nm, e.g. between 20 and 80 nm, or between 50 and 75 nm.

Example 7 provides the III-N semiconductor device assembly according to any one of the preceding Examples, where the portion of the III-N structure provided over the dielectric layer is a first portion, the dielectric layer has an opening (e.g. the opening described herein as the "III-N seeding opening") where the dielectric material is not present (i.e. where there is no dielectric material over the substrate), and the III-N structure further includes a second portion provided over, including in, the opening.

Example 8 provides the III-N semiconductor device assembly according to Example 7, where the second portion has a height substantially equal to a thickness of the dielectric layer and a height of the first portion.

Example 9 provides the III-N semiconductor device assembly according to any one of the preceding Examples, where the dielectric material includes one or more of a compound including silicon and oxygen (e.g., SiO2), and a compound including hafnium and oxygen (e.g., HfO2). In general, the dielectric material of the III-N growth blocking layer may e.g. Include any of the low-k or high-k dielectric materials described herein including but not limited to elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used as the III-N growth blocking material may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. Examples of low-k materials that may be used as the III-N growth blocking material may include, but are not limited to, fluorine-doped silicon dioxide, carbon-doped silicon dioxide, spin-on organic polymeric dielectrics such as e.g. polyimide, polynorbornenes, benzocyclobutene, and polytetrafluoroethylene (PTFE), or spin-on silicon-based polymeric dielectric such as e.g. hydrogen silsesquioxane (HSQ) and methylsilsesquioxane (MSQ)).

Example 10 provides the III-N semiconductor device assembly according to any one of the preceding Examples, where the III-N semiconductor device assembly is a III-N transistor and the III-N semiconductor device assembly further includes a transistor gate stack including a gate electrode material disposed over a portion of the III-N semiconductor material, preferably substantially over the portion that is provided above the dielectric layer, and a high-k dielectric material disposed between the gate electrode material and the III-N semiconductor material.

Example 11 provides the III-N semiconductor device assembly according to Example 10, where the high-k dielectric material is in contact with the gate electrode material.

Example 12 provides the III-N semiconductor device assembly according to Examples 10 or 11, where the high-k dielectric material has a thickness between about 0.5 and 8 nm.

Example 13 provides the III-N semiconductor device assembly according to any one of Examples 10-12, where the high-k dielectric material includes hafnium oxide.

Example 14 provides the III-N semiconductor device assembly according to any one of Examples 10-12, where the high-k dielectric material includes zirconium oxide, aluminum oxide, tantalum oxide, tantalum silicon oxide, hafnium silicon oxide, or lanthanum oxide.

Example 15 provides the III-N semiconductor device assembly according to any one of the preceding Examples, further including a polarization layer provided over at least a portion of the III-N semiconductor material.

Example 16 provides the III-N semiconductor device assembly according to Example 15, where the polarization layer includes at least one of a material including aluminum and nitrogen (e.g. AlN), a material including indium, aluminum and nitrogen (e.g. InAlN), or a material including aluminum, gallium and nitrogen (e.g. AlGaN).

Example 17 provides a III-N transistor that includes a channel material including a III-N semiconductor material shaped as a wire (i.e., said III-N transistor is a non-planar transistor); a gate electrode material at least partially wrapping around at least a portion of the wire; a high-k dielectric material provided between the gate electrode material and the III-N semiconductor material of the wire; a source region; and a drain region.

Example 18 provides the III-N transistor according to Example 17, where a height of the wire is less than about 200 nm, e.g. between about 5 and 50 nm, or between about 10 and 20 nm.

Example 19 provides the III-N transistor according to Examples 17 or 18, where a width of the wire is between about 2 and 30 nm, e.g. between about 3 and 20 nm, or between about 4 and 10 nm.

Example 20 provides the III-N transistor according to any one of Examples 17-19, where the III-N transistor has a gate length (i.e. a distance between the source region and the drain region) below 250 nm, e.g. between 10 and 250 nm, e.g. between about 35 and 90 nm, or between about 35 and 50 nm.

Example 21 provides a method of fabricating a III-N semiconductor device assembly. The method includes providing a III-N growth blocking layer over a substrate; providing a III-N seeding opening in the III-N growth blocking layer; providing a three-dimensional structure of a sacrificial material over and beyond the III-N seeding opening; at least partially enclosing the structure with a shell material; forming a cavity in the shell material by removing at least a portion of the sacrificial material through a first opening in the shell material; and epitaxially growing a III-N semiconductor material within the cavity by supplying one or more fluid precursors into the cavity through a second opening, the second opening being a same or a different opening than the first opening.

Example 22 provides the method according to Example 21, where removing at least a portion of the sacrificial material includes removing at least a portion of the sacrificial material to expose a portion of the substrate, i.e.

removing at least a portion of the sacrificial material within the III-N seeding opening in the III-N growth blocking layer so that the exposed portion of the substrate can serve as an area from which the epitaxial growth of the III-N material is seeded.

Example 23 provides the method according to Examples 21 or 22, where removing at least a portion of the sacrificial material includes performing an etch of the sacrificial material through the first opening. In various embodiments, such an etch may include undercut etch such as wet etch approaches.

Example 24 provides the method according to any one of Examples 21-23, where epitaxially growing the III-N semiconductor material includes growing a portion of the III-N semiconductor material over at least a portion of the III-N growth blocking layer by lateral epitaxial overgrowth.

Example 25 provides the method according to any one of Examples 21-24, where the shell material includes a material that includes aluminum and nitrogen (e.g. AlN), and where at least partially enclosing the structure with the shell material includes depositing the shell material using metal organic chemical vapor deposition or sputtering.

Example 26 provides the method according to any one of Examples 21-25, further including, following the epitaxial growth of the III-N semiconductor material, removing at least a portion of the shell material. In various embodiments, the shell material may be removed using combination of wet etch and dry etch.

Example 27 provides the method according to any one of Examples 21-26, where the III-N growth blocking layer includes one or more of a compound including silicon and oxygen (e.g., SiO2), and a compound including hafnium and oxygen (e.g., HfO2).

Example 28 provides the method according to any one of Examples 21-27, where the cavity has a height less than about 200 nm, e.g. between about 5 and 50 nm, or between about 10 and 20 nm (i.e. a thickness of the resulting III-N wire is less than about 200 nm, e.g. In the ranges provided for the height of the cavity).

Example 29 provides the method according to any one of Examples 21-28, where the cavity has a width between about 2 and 30 nm, e.g. between about 3 and 20 nm, or between about 4 and 10 nm (i.e. the width of the resulting III-N wire is between about 2 and 30 nm, e.g. In the ranges provided for the width of the cavity).

In various further examples, the method according to any one of Examples 21-29 may be used to form the III-N semiconductor device assembly according to any one of Examples 1-20. In particular, epitaxially growing the semiconductor material within the cavity according to any one of Examples 21-29 may result in forming the structure over the substrate according to any one of Examples 1-20.

Example 30 provides a computing device that includes a carrier substrate and an integrated circuit (IC) die coupled to the carrier substrate. The IC die includes at least one device component including a III-N semiconductor material shaped as a wire having a height less than about 200 nm, e.g. between about 5 and 50 nm, or between about 10 and 20 nm, and a width between about 2 and 30 nm, e.g. between about 3 and 20 nm, or between about 4 and 10 nm.

Example 31 provides the computing device according to Example 30, where the at least one III-N device component is a transistor and the semiconductor material is a channel material of the III-N transistor.

Example 32 provides the computing device according to Examples 30 or 31, where the IC die further includes a dielectric layer, where at least a portion of the wire is provided over the dielectric layer.

Example 33 provides the computing device according to any one of Examples 30-32, where the computing device is a wearable or handheld computing device.

Example 34 provides the computing device according to any one of Examples 30-33, where the computing device further includes one or more communication chips and an antenna.

Example 35 provides the computing device according to any one of Examples 30-34, where the carrier substrate is a motherboard.

In various further examples, the computing device according to any one of Examples 30-35 may include the III-N semiconductor device assembly according to any one of Examples 1-20. In particular, the IC die of the computing device according to any one of Examples 30-35 may be, or may include, the III-N semiconductor device assembly according to any one of Examples 1-20.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The invention claimed is:

1. A method of fabricating a III-N semiconductor device assembly, the method comprising:
    providing a III-N growth blocking layer over a substrate;
    providing a III-N seeding opening in the III-N growth blocking layer;
    providing a structure of a sacrificial material over and beyond the III-N seeding opening;
    at least partially enclosing the structure with a shell material, wherein the shell material comprises a material that includes aluminum and nitrogen;
    forming a cavity in the shell material by removing the sacrificial material through a first opening in the shell material; and
    epitaxially growing a III-N semiconductor material within the cavity by supplying one or more precursors into the cavity through a second opening, the second opening being a same or a different opening than the first opening.

2. The method according to claim 1, wherein removing the sacrificial material comprises removing at least a portion of the sacrificial material to expose a portion of the substrate.

3. The method according to claim 1, wherein removing the sacrificial material comprises performing an etch of the sacrificial material through the first opening.

4. The method according to claim 1, wherein epitaxially growing the III-N semiconductor material comprises growing a portion of the III-N semiconductor material over at least a portion of the III-N growth blocking layer by lateral epitaxial overgrowth.

5. The method according to claim 1, wherein enclosing the structure with the shell material comprises depositing the shell material using metal organic chemical vapor deposition or sputtering.

6. The method according to claim 1, further comprising, after epitaxially growing the III-N semiconductor material within the cavity, removing at least a portion of the shell material.

7. The method according to claim 1, wherein the cavity has a height less than 200 nanometers and a width between 2 and 30 nanometers.

8. A method of fabricating an integrated circuit (IC) device, the method comprising:
providing a layer over a substrate;
providing an opening in the layer;
providing a structure of a sacrificial material over and beyond the opening;
at least partially enclosing the structure with a shell material, wherein enclosing the structure with the shell material comprises depositing the shell material using metal organic chemical vapor deposition or sputtering and wherein the shell material includes aluminum and nitrogen;
forming a cavity in the shell material by removing the sacrificial material through a first opening in the shell material; and
epitaxially growing a semiconductor material within the cavity by supplying one or more precursors into the cavity through a second opening, the second opening being a same or a different opening than the first opening, the semiconductor material including nitrogen and an element from group III of periodic system.

9. The method according to claim 8, wherein removing the sacrificial material comprises removing at least a portion of the sacrificial material to expose a portion of the substrate.

10. The method according to claim 8, wherein removing the sacrificial material comprises performing an etch of the sacrificial material through the first opening.

11. The method according to claim 8, wherein epitaxially growing the semiconductor material comprises growing a portion of the semiconductor material over at least a portion of the layer by lateral epitaxial overgrowth.

12. The method according to claim 8, wherein depositing the shell material includes depositing the shell material at a temperature of at least about 1000 degrees Celsius.

13. The method according to claim 8, further comprising, after epitaxially growing the III-N semiconductor material within the cavity, removing at least a portion of the shell material.

14. The method according to claim 8, wherein the cavity has a height less than 200 nanometers and a width between 2 and 30 nanometers.

15. The method according to claim 8, wherein the layer includes a dielectric material.

16. The method according to claim 8, wherein epitaxially growing the semiconductor material comprises growing the semiconductor material with a portion of the substrate exposed by the opening in the layer as a seed surface.

17. A method of fabricating an integrated circuit (IC) device, the method comprising:
covering, with a first material, an area of a crystalline material, leaving an opening in the first material to expose a portion of the crystalline material;
providing a structure of a second material over the opening in the first material and over at least a portion of the first material;
enclosing the structure with a third material, leaving an opening in the structure to expose a portion of the second material, wherein the third material includes aluminum and nitrogen;
removing the second material through the opening in the structure; and
epitaxially growing a semiconductor material in a region where the second material was removed, wherein at least a portion of the semiconductor material is grown by lateral epitaxial overgrowth starting from the opening in the first material.

18. The method according to claim 17, wherein enclosing the structure with the third material includes depositing the third material at a temperature of about 1000 Celsius.

19. The method according to claim 17, wherein enclosing the structure with the third material comprises depositing the third material using metal organic chemical vapor deposition or sputtering.

* * * * *